United States Patent
Tanizaki et al.

[11] Patent Number: 6,163,488
[45] Date of Patent: Dec. 19, 2000

[54] SEMICONDUCTOR DEVICE WITH ANTIFUSE

[75] Inventors: Hiroaki Tanizaki; Hiroki Shimano; Shigeki Tomishima, all of Hyogo, Japan

[73] Assignee: Mitsubishi Denki Kabushiki Kaisha, Tokyo, Japan

[21] Appl. No.: 09/281,901

[22] Filed: Mar. 31, 1999

[30] Foreign Application Priority Data

Oct. 26, 1998 [JP] Japan ................................. 10-303898

[51] Int. Cl.[7] .................................................. G11C 13/00
[52] U.S. Cl. ......................... 365/200; 365/96; 365/225.7
[58] Field of Search ............................ 365/96, 102, 103, 365/200, 225.7

[56] References Cited

U.S. PATENT DOCUMENTS

| | | | |
|---|---|---|---|
| 5,243,226 | 9/1993 | Chan | 365/103 |
| 5,526,312 | 6/1996 | Eltoukhy | 365/225.7 |
| 5,631,862 | 5/1997 | Cutter et al. | |

OTHER PUBLICATIONS

"A Low–Power Sub 100 ns 256K Bit Dynamic RAM", S. Fujii et al., IEEE Journal of Solid–State Circuits, vol. SC–18, No. 5, Oct. 1983, pp. 441–446.

*Primary Examiner*—Terrell W. Fears
*Attorney, Agent, or Firm*—McDermott, Will & Emery

[57] ABSTRACT

In a DRAM with an antifuse for programming a defective address, the antifuse and one electrode of a capacitor are connected to a shared node and the other electrode of the capacitor receives a boost signal. To blow the antifuse, the shared node is set high. To maintain the antifuse unblown, the shared node is set low. Then the boost signal is raised high to boost the shared node. Even when the resistance value of antifuse 1 is decreased, excessive current does not flow. This eliminates the necessity of providing a protection circuit as conventional and thus reduces circuit scale.

17 Claims, 20 Drawing Sheets

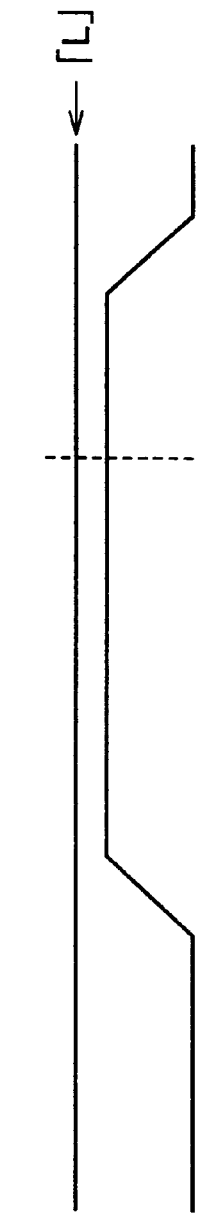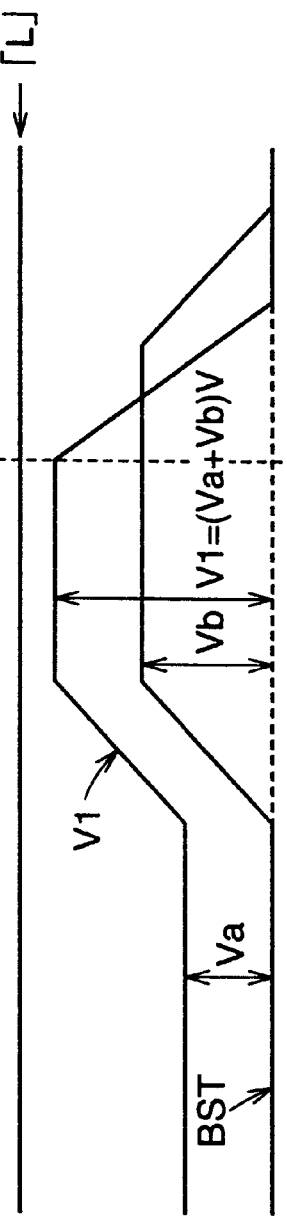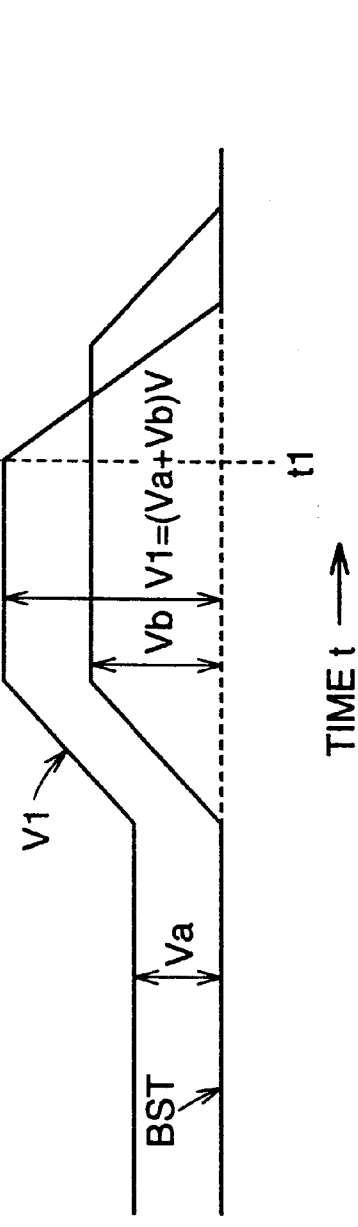

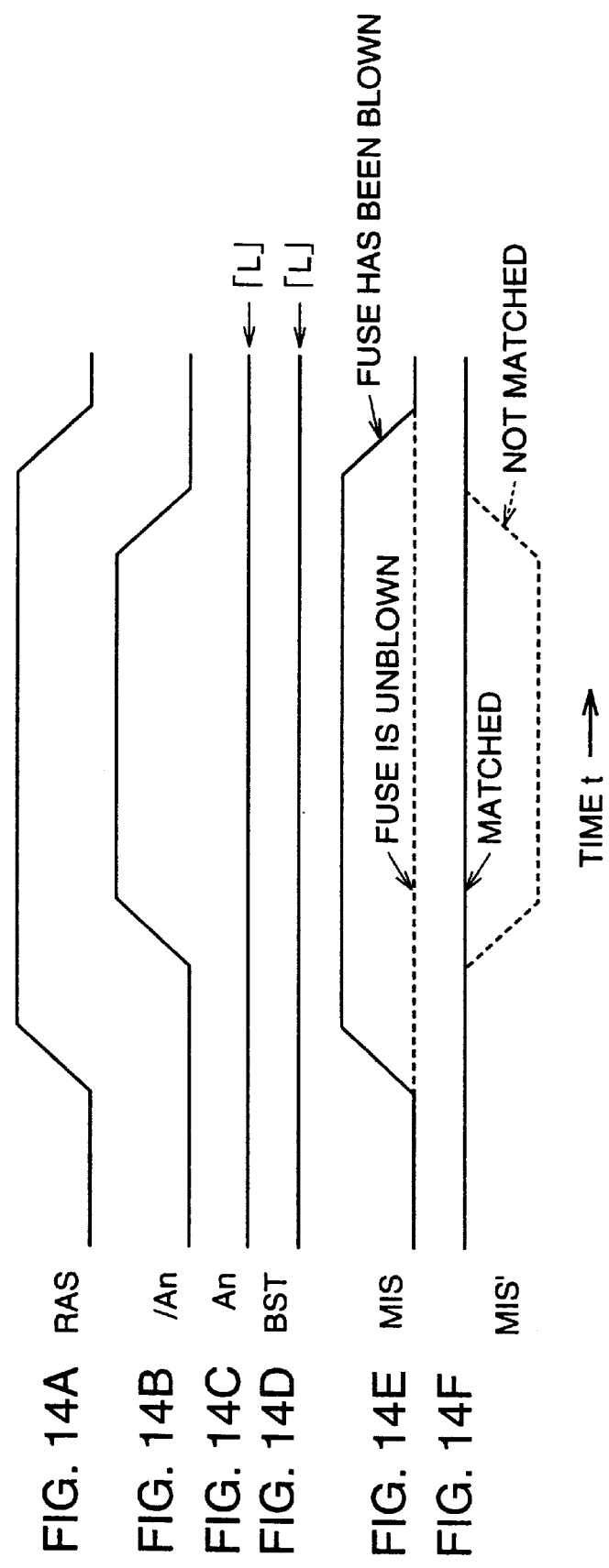

SEMICONDUCTOR DEVICE WITH ANTIFUSE

BACKGROUND OF THE INVENTION

1. Field of the Invention

The present invention relates to semiconductor devices and in particular to semiconductor devices with an antifuse having a resistance value reduced when it is blown.

2. Description of the Background Art

FIG. 18 is a block diagram showing a configuration of a conventional dynamic random access memory (DRAM) 30. Referring to FIG. 18, DRAM 30 includes a clock generation circuit 31, a row and column address buffer 32, a row decoder 33, a column decoder 34, a redundant column decoder 35, a memory mat 36, an input buffer 40 and an output buffer 41, memory mat 36 including a memory array 37, a redundant memory array 38 and a sense amplifier+input/output control circuit 39.

Clock generation circuit 31 responds to externally applied signals /RAS and /CAS to select a predetermined mode of operation to generally control DRAM 30.

Row and column address buffer 32 responds to address signals A0 to An, n representing an integer no less than 0, to generate row address signals RA0 to RAn and column address signals CA0 to CAn for supply to row decoder 33 and column decoders 34 and 35, respectively.

Memory array 37 includes a plurality of memory cells arranged in a matrix, each storing 1-bit data. Each memory cell is arranged at a predetermined address determined according to row and column addresses.

Row decoder 33 responds to row address signals RA0 to RAn from row and column address buffer 32 to designate a row address in memory array 37. Column decoder 34 responds to column address signals CA0 to CAn from row and column address buffer 32 to designate a column address in memory array 37.

In column decoder 34 and redundant column decoder 35 is provided a group of fuses (not shown) for programming a column address of memory array 37 that includes a defective memory cell and a column address of a redundant memory array 35 that replaces the column address including the defective memory cell. When column address signals CA0 to CAn are input that correspond to a defective column address programmed by the group of fuses, column decoder 34 does not designate the column address and redundant column decoder 35 designates a programmed column address of redundant memory array 38 rather than the defective column address. Thus, a defective memory cell column in memory array 37 that includes a defective memory cell is replaced by a normal memory cell column of redundant memory array 38.

Sense amplifier+input/output control circuit 39 connects a memory cell of an address designated by row decoder 33 and column decoder 34 (or redundant column decoder 35) to one end of a data input/output line pair IOP. The other end of data input/output line pair IOP is connected to input and output buffers 40 and 41. Input buffer 40 responds to an externally applied signal /W in a write mode to supply externally input data to a selected memory cell via data input/output line pair IOP. Output buffer 41 responds to an externally input signal /OE in a read mode to externally output data read from a selected memory cell.

FIG. 19 is a circuit block diagram showing a partially omitted configuration of the FIG. 18 DRAM memory mat 36.

Referring to FIG. 19, memory array 37 includes a plurality of memory cells MC arranged in a matrix, a word line WL corresponding to each row, and a pair of bit lines BL, /BL corresponding to each column.

Each memory cell MC is of a well-known type, including an n-channel MOS transistor for access and a capacitor for storage of information. Word line WL transmits an output from row decoder 33 to activate memory cells MC of a selected row. The pair of bit lines BL, /BL inputs and outputs a data signal to and from a selected memory cell MC.

Redundant memory array 38 is similar in configuration to memory array 37, except that it is smaller than memory array 37 in the number of columns. Memory array 37 and redundant memory array 38 have the same number of rows and share word line WL.

Sense amplifier+input/output control circuit 39 includes a column select gate 42, a sense amplifier 34 and an equalizer 44, each provided for a respective column. Column select gate 42 includes a pair of n-channel MOS transistors connected between the pair of bit lines BL, /BL and a pair of data input and output lines IO, /IO. The gate of each n-channel MOS transistor is connected to column decoder 34 or 35 via a column select line CSL. When column decoder 34 or 35 causes column select line CSL to attain a selected high level, the pair of n-channel MOS transistors are turned on to couple the pair of bit lines BL, /BL and the pair of data input and output lines IO,/IO together.

Sense amplifier 43 amplifies a fine difference in potential between paired bit lines BL and /BL to a power supply voltage Vcc when sense amplifier activation signals SE and /SE respectively attain high and low levels. Equalizer 44 equalizes the potentials of bit lines BL, /BL to a bit line potential VBL=Vcc/2 when a bit line equalization signal BLEQ attains an active high level.

An operation of the FIGS. 18 and 19 DRAM will now be described briefly. In a write mode, column decoder 34 or 35 allows column select line CSL of a column corresponding to column address signals CA0-CAn to attain a high level to turn on column select gate 42.

Input buffer 40 responds to signal /W to supply external write data to the pair of bit lines BL, /BL of the selected column via data input/output line pair IOP. The write data is supplied as a potential difference between bit lines BL and /BL. Then, row decoder 33 allows word line WL of a row corresponding to row address signals RA0-RAn to attain an active high level to turn on the n-channel MOS transistors of memory cells MC of the row. The capacitor of a selected memory cells MC stores the amount of electrical charge that corresponds to the potential of bit line BL or /BL.

In a read mode, bit line equalization signal BLEQ initially falls to a low level to stop equalization of bit lines BL and /BL. Row decoder 33 allows word line WL of a row corresponding to row address signals RA0-RAn to attain a selected high level. The potentials of bit lines BL and /BL slightly vary depending on the amount of electrical charge in the capacitor of an activated memory cell MC.

Then, sense amplifier activation signals SE and /SE attain high and low levels, respectively, to activate sense amplifier 43. When the potential of bit line BL is slightly higher than that of bit line /BL, the potential of bit line BL is pulled up to a high level and that of bit line /BL is pulled down to a low level. When the potential of bit line /BL is slightly higher than that of bit line BL, the potential of bit line /BL is pulled up to a high level and that of bit line BL is pulled down to a low level.

Then, column decoder 34 or 35 allows column select line CSL of a column corresponding to column address signals CA0-CAn to attain a selected high level to turn on column select gate 42 of the column. The data of bit line pair BL, /BL of the selected column is supplied to output buffer 41 via column select gate 42 and the pair of data input and output lines IO, /IO. Output buffer 41 responds to a signal /OE to externally output read data.

If column address signals CA0-CAn correspond to a column including any defective memory cell MC, the write and read operations are performed similarly, except that a column of redundant memory array 38 is selected in place of the column including the defective memory cell MC.

Thus in memory integrated circuits such as DRAM the system of replacing defective rows and columns with spare rows and columns are adopted and a program circuit for previously programming addresses of defective rows and columns is provided to increase the ratio of satisfactory chips on a wafer.

FIG. 20 is a circuit diagram showing a configuration of such program circuits as described above. One such program circuit is disclosed e.g. in *IEEE Journal of Solid-State Circuits,* Vol. SC-18(1983), pp. 441–446.

The program circuit shown in FIG. 20 includes a p-channel MOS transistor 51, fuses 50. 0-50.n, 52. 0'-52.n', and n-channel MOS transistors 53. 0-53.n, 53.0-53.n'. P-channel MOS transistor 51 is connected between a line of a power supply potential Vcc and output node N51 and has its gate receiving a signal RP.

Fuse 52.0 and n-channel MOS transistor 53.0 are provided for address signal A0 (i.e. a row address signal RA0 or a column address signal CA0) and connected in series between output node N51 and a line of ground potential GND. Fuse 52.0' and n-channel MOS transistor 53.0' are provided for a signal /A0 complementary to address signal A0 and connected in series between output node N51 and a line of ground potential GND. N-channel MOS transistors 53.0, 53.0' have their respective gates receiving signals A0, /A0, respectively. It should be noted that complementary address signal /A0 is generated in a row and column address buffer or decoder. Other fuses 52.1-52.n, 52.1'-52.n, and n-channel MOS transistors 52.1-52.n, 52.1'-52.n' are similar. Fuses 52.0-52.n, 52.0-52.n' are formed from polysilicon wire or aluminum wire. A potential of output node N51 serves as an output signal φDA.

A defective address is programmed by laser-cutting a fuse corresponding to the defective address. When an input address matches a programmed defective address, a non-conducting state is achieved between output node N51 and a line of ground potential GND and, in response to signal RP that goes low, signal φDA goes high. Responsively, a defective row or column is replaced by a spare row or column.

When an input address does not match a programmed defective address, a conducting state is achieved between output node N51 and a line of ground potential GND, and signal φDA remains low even when signal RP goes low. Thus, replacement of rows or columns is not performed.

However, the program circuit shown in FIG. 20, using a laser device to cut fuses, requires high device cost and is poor in the precision of fuse-cutting.

Thus, consideration has been given to a program circuit with antifuses, which dispenses with a laser device. The antifuse has a capasitive structure, serving as a capacitor or an open circuit when it is intact. However, when a high voltage (of approximately no less than 10V) is applied thereto to blow it, a conductive path is created in the insulation layer to render the antifuse a resistance element having a resistance value of approximately several kΩ.

FIG. 21 is a circuit diagram showing a configuration of a fuse circuit including such an antifuse and a blow circuit therefor. Such a fuse circuit is disclosed e.g. in U.S. Pat. No. 5,631,862.

The fuse circuit shown in FIG. 21 includes an antifuse 61, p-channel MOS transistors 62–64, n-channel MOS transistors 65–69, and an inverter 70. MOS transistors 62, 64, 65 are connected in series between a power supply potential Vcc line and a node N65. P-channel MOS transistor 62 has its gate receiving a signal TRAS. Signal TRAS is a trigger signal which is held low during address detection period and is otherwise held high.

P-channel MOS transistor 64 has its gate connected to a ground potential GND line so that transistor 64 is normally turned on. The channel length and channel width of p-channel MOS transistor 64 is designed such that p-channel MOS transistor 65 has a conduction resistance value of approximately 300kΩ. N-channel MOS transistor 65 has its gate receiving a signal DVCE. Signal DVCE is a signal enabling the fuse circuit, adapted to be half the level of power supply potential Vcc, i.e. Vcc/2, in blowing antifuse 61 and in detecting an address. The channel length and channel width of n-channel MOS transistor 65 is set such that the voltage driving capability of n-channel MOS transistor 65 is greater than that of p-channel MOS transistor 64.

Inverter 70 is connected between a node N64 between MOS transistors 64 and 65, and the gate of p-channel MOS transistor 63. A signal output from inverter 70 serves as an output signal FR of the fuse circuit. Signal FR serves as a signal input to an NOR- or NAND-type address comparator circuit for comparing an input address signal to a programmed address signal ADDR.

N-channel MOS transistor 66 is connected between node N65 and a ground potential GND line and has its gate receiving a reset signal RST. Reset signal RST is set high in setting an initial state of the fuse circuit. N-channel MOS transistors 67, 68 are connected in series between node N65 and a ground potential GND line and have their respective gates receiving address signal ADDR and signal FR, respectively.

N-channel MOS transistor 69 is connected between node N65 and one electrode of antifuse 61 and has its gate connected to a power supply potential Vcc line. In blowing antifuse 61, n-channel MOS transistor 69 prevents n-channel MOS transistors 65–67 from receiving between their respective sources and gates or their respective drains and gates a voltage of no less than the breakdown voltage of the gate oxide film to protect n-channel MOS transistors 65–67.

The other electrode of antifuse 61 is connected a terminal T61. Terminal T61 receives ground potential GND in a normal mode of operation and receives a high voltage in blowing antifuse 61.

An operation of the fuse circuit will now be described. To program a defective address, signal TRAS is initially set high and signal RST is raised high to set nodes N64, N65 low and signal FR is raised high before signal RST is returned low.

Then, address signal ADDR corresponding to the effective address is set high and one electrode of antifuse 61 is grounded via n-channel MOS transistors 69, 67, 68. Then, the high voltage is applied to terminal T61 to blow antifuse 61.

When antifuse 61 is blown, current flows from terminal T61 via antifuse 61 and n-channel MOS transistors 69, 67, 68 to the ground potential GND line and as the current increases the potentials of nodes N64, N65 are also increased. When the node N64 potential exceeds the logical threshold voltage of inverter 70, signal FR goes low and n-channel MOS transistor 68 is thus turned off to shut the current path to the ground potential GND line. This prevents excessively large current from flowing through the circuit when antifuse 61 is blown.

In the normal mode of operation, terminal T61 is grounded and signal TRAS goes low. When antifuse 61 is unblown, nodes N64, N65 go high and signal FR is latched low.

When antifuse 61 is blown, it serves as a resistance element of several kΩ and node N65 thus attains ground potential GND. Since n-channel MOS transistor 65 is greater in current driving capability than p-channel MOS transistor 64, the node N64 potential is lower than the logical threshold potential of inverter 70 and signal FR thus goes high. When an address is input that corresponds to an address detection circuit block with signal FR high, determination is made that a defective address has been input and the corresponding defective row or column is substituted by a spare row or column.

However, the conventional fuse circuit using an externally applied high voltage to blow antifuse 61 requires a protection circuit for preventing excessive current from flowing through the circuit when the antifuse 61 resistance value is decreased and it also requires separately a control circuit for controlling the externally applied high voltage, disadvantageously resulting in increasing the scale of the circuit.

SUMMARY OF THE INVENTION

A main object of the present invention is therefore to provide a semiconductor device with an antifuse, small in circuit scale and operating less erroneously.

In a semiconductor device in one aspect of the present invention, one electrode of an antifuse is connected to one electrode of a capacitor, a first voltage apply circuit charges the capacitor with a power supply voltage and a second voltage apply circuit applies a power supply voltage to the other electrode of the charged capacitor to blow the antifuse. When the antifuse is blown and its resistance value is decreased, the antifuse, connected in series with the capacitor, prevents excessive current from flowing through the circuit and any conventional protection circuit is not required. Furthermore, the use of power supply voltage eliminates the necessity of providing a circuit controlling high voltage eliminates the necessity of providing a circuit controlling an external high voltage conventionally used. This reduces the scale of the circuit.

Preferably, the first voltage apply circuit charges the capacitor with the power supply voltage when an input signal attains a first logical level, and discharges the capacitor when the input signal attains a second logical level. The antifuse is blown when the capacitor is charged and the antifuse is not blown when the capacitor is discharged. Thus, the antifuse is blown for an input signal of the first logical level and the antifuse is not blown for the input signal of the second logical level, and the logical level of the input signal can be programmed.

Still preferably, the other electrode of the antifuse is connected to a line of a first power supply potential, the first voltage apply circuit includes a first switch connected between one electrode of the capacitor and a line of a second power supply potential conducting when an input signal attains the first logical level, and a second switch connected between one electrode of the capacitor and the line of the second power supply potential and conducting when the input signal attains the second logical level. This allows the first voltage apply circuit to be readily configured.

Still preferably, there are also provided a third switch connected between the line of the second power supply potential and a second electrode of the first switch and conducting in program operation and conducting in determination operation during a predetermined period before a signal is input, and a determination circuit detecting a potential of the second electrode of the third switch in the determination operation after the signal is input to use a result of the detection to determine the logical level of the input signal. This allows determination of the logical level of the input signal.

Still preferably, there is also provided a resistance detection circuit detecting whether the resistance value of the antifuse is higher or lower than a predetermined resistance value to output a signal of a level depending on a result of the detection. Thus it can be checked whether the antifuse has been blown normally.

Still preferably, the semiconductor is a semiconductor memory device with a redundant circuit, the antifuse and the first voltage apply circuit being provided for each of a plurality of address signals and each of a plurality of complementary address signals, the first voltage apply circuit receiving a respective inverted version in logical level of each of a plurality of address signals and of each of a plurality of complementary address signals specifying an address with a defective memory cell. The determination circuit detects whether the potential of the second electrode of the third switch is closer to either the first or second power supply potential in the determination operation after the plurality of address signals and the plurality of complementary address signals are input. When the potential of the second electrode of the third switch is closer to the first power supply potential, the determination circuit determine that a normal address has been input. When the potential of the second electrode of the third switch is closer to the second power supply potential, the determination circuit determines that an address with a defective memory cell has been input. This allows the redundant circuit of the semiconductor memory device to be readily configured.

Still preferably, the semiconductor device is a semiconductor memory device with a redundant circuit, the antifuse, the first voltage apply circuit, the third switch and the determination circuit being provided for each of a plurality of address signals, the first voltage apply circuit receiving in the program operation a respective inverted version in logical level of each of a plurality of address signals specifying an address of a defective memory cell. In the determination operation, each first voltage apply circuit receives a signal of the first logical level rather than the corresponding address, and each determination circuit detects in the determination operation after the signal of the first logical level is input whether the potential of the second electrode of the third switch is closer to the first or second power supply potential. When the potential of the second electrode of the third switch is closer to the first power supply potential, the determination circuit outputs a signal of the first logical level. When the potential of the second electrode of the third switch is closer to the second power supply potential, the determination circuit outputs the signal of the second logical level. A total-determination circuit detects whether a logical level of each inverted version of signals output from the plurality of determination circuits matches a logical level of each of a plurality of input address signals. When the logical levels match, the total-determination circuit determines that an address of a defective memory cell has been input. This allows the redundant circuit of the semiconductor memory device to be readily configured and also allows for rapid and stable determination operation.

Still preferably, the total-determination circuit includes a precharging, fourth switch, first and second transistors for leaking precharged electrical charge when a corresponding address signal matches a signal output from a corresponding determination circuit, and third and fourth transistors for leaking precharged electrical charge when a corresponding complementary address signal matches an inverted version of a signal output from a corresponding determination circuit, determining that an address of a defective memory cell has been input when precharged electrical charge leaks after the address has been input. This allows the total-determination circuit to be readily configured.

Still preferably, there are also provided a resistance detection circuit, a control circuit, and a logic circuit. The resistance detection circuit is provided for each antifuse, outputting a signal of a first level when a corresponding antifuse has a resistance value higher than a predetermined resistance value and outputting the signal of a second level when the corresponding antifuse has a resistance value lower than the predetermined resistance value. The control circuit couples a blown one of a plurality of antifuses with a corresponding resistance detection circuit and sets to the second level a signal output from a resistance detection circuit for an unblown antifuse. The logic circuit responds to the plurality of resistance detection circuits all outputting the signal of the second level to output a signal indicative of normal antifuse-blowing. Thus, it can be checked whether antifuse blowing has been performed normally so that the circuit can be prevented from erroneous operation.

Still preferably, there are also provided a resistance detection circuit detecting whether a resistance value of an antifuse is higher or lower than a predetermined resistance value to output a signal of a level depending on a result of the detection, and a select circuit selecting any one of a plurality of antifuses and coupling the selected antifuse with the resistance detection circuit. Thus, it can be checked whether antifuse blowing has been performed normally so that the circuit can be prevented from erroneous operation. Furthermore, only a single resistance detection circuit is required, so that the scale of the circuit can be reduced.

In another aspect of the present invention, a semiconductor device with an antifuse is provided with a resistance detection circuit detecting whether a resistance value of the antifuse is higher or lower than a predetermined resistance value to output a signal of a level depending on a result of the detection. Thus, it can be checked whether antifuse blowing has been performed normally so that the circuit can be prevented from erroneous operation.

Still preferably, one electrode of the antifuse is connected to a line of a first power supply potential, and the resistance detection circuit includes a transistor connected between the other electrode of the antifuse and a line of a second power supply potential and turned on at a predetermined conduction resistance value in a test mode, and a potential comparator circuit comparing a potential of the other electrode of the antifuse to a predetermined reference potential in the test mode to output a signal of a level depending on a result of the comparison. This allows the resistance detection circuit to be readily configured.

Still preferably, there are provided a plurality of antifuses, and the resistance detection circuit is provided for each antifuse, outputting a signal of the first level when a respective antifuse has a resistance value higher than the predetermined resistance value and outputting the signal of the second level when the respective antifuse has a resistance value lower than the predetermined resistance value. There are also provided a control circuit coupling a blown one of the plurality of antifuses with a respective resistance detection circuit and also setting to the second level at signal output from a resistance detection circuit for an unblown antifuse, and a logic circuit responding to the plurality of resistance detection circuits all outputting the signal of the second level to output a signal indicating that antifuse blowing has been performed normally. This allows ready and rapid detection of whether a plurality of antifuses have been blown normally.

Still preferably, there are also provided a plurality of antifuses, and also a select circuit selecting any one of the plurality of antifuses and coupling the selected antifuse with a resistance detection circuit. This allows a single resistance detection circuit to be used to check whether a plurality of antifuses have been blown normally, so that the scale of the circuit can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 13A–13D are timing diagrams representing program operation of the FIG. 12 redundancy determination circuit.

FIGS. 14A–14F are timing diagrams representing determination operation of the FIG. 12 redundancy determination circuit.

DESCRIPTION OF THE PREFERRED EMBODIMENTS

First Embodiment

Figure 1:
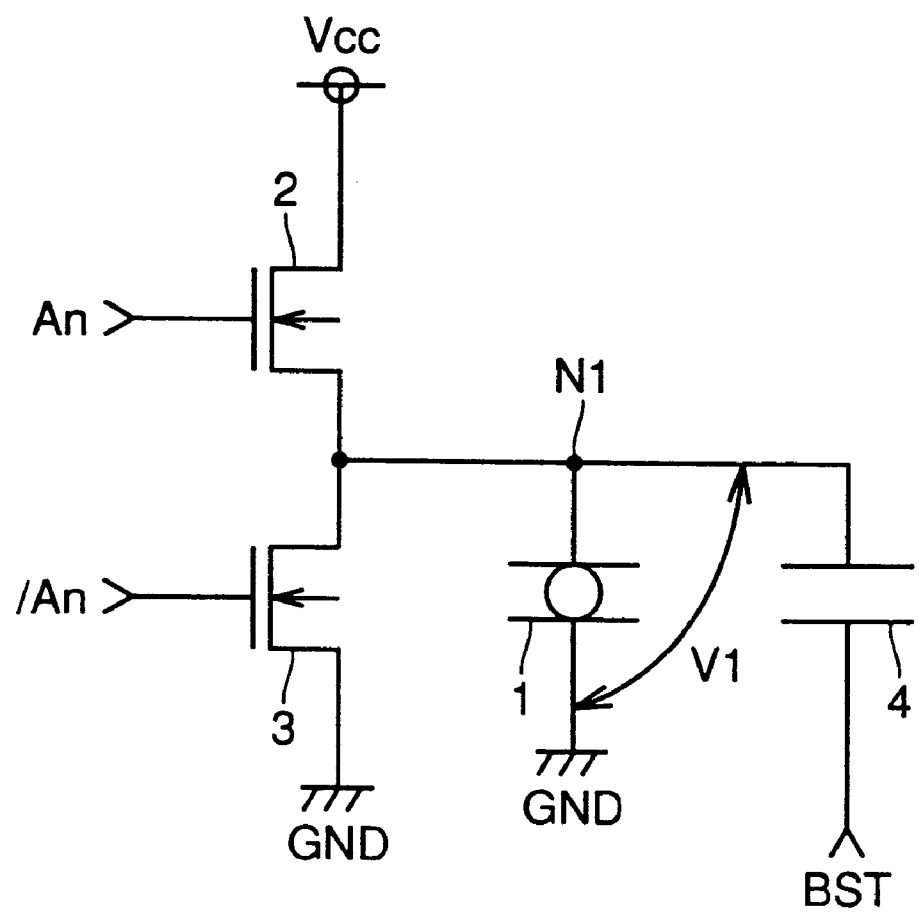
FIG. 1 is a circuit diagram showing a configuration of a fuse circuit according to a first embodiment of the present invention.

FIG. 1 is a circuit diagram showing a configuration of a fuse circuit according to a first embodiment of the present invention. The fuse circuit shown in FIG. 1 includes an antifuse 1, n-channel MOS transistors 2, 3, and a capacitor 4. N-channel MOS transistors 2,3 and capacitor 4 form a blow circuit for blowing antifuse 1.

Figure 18:
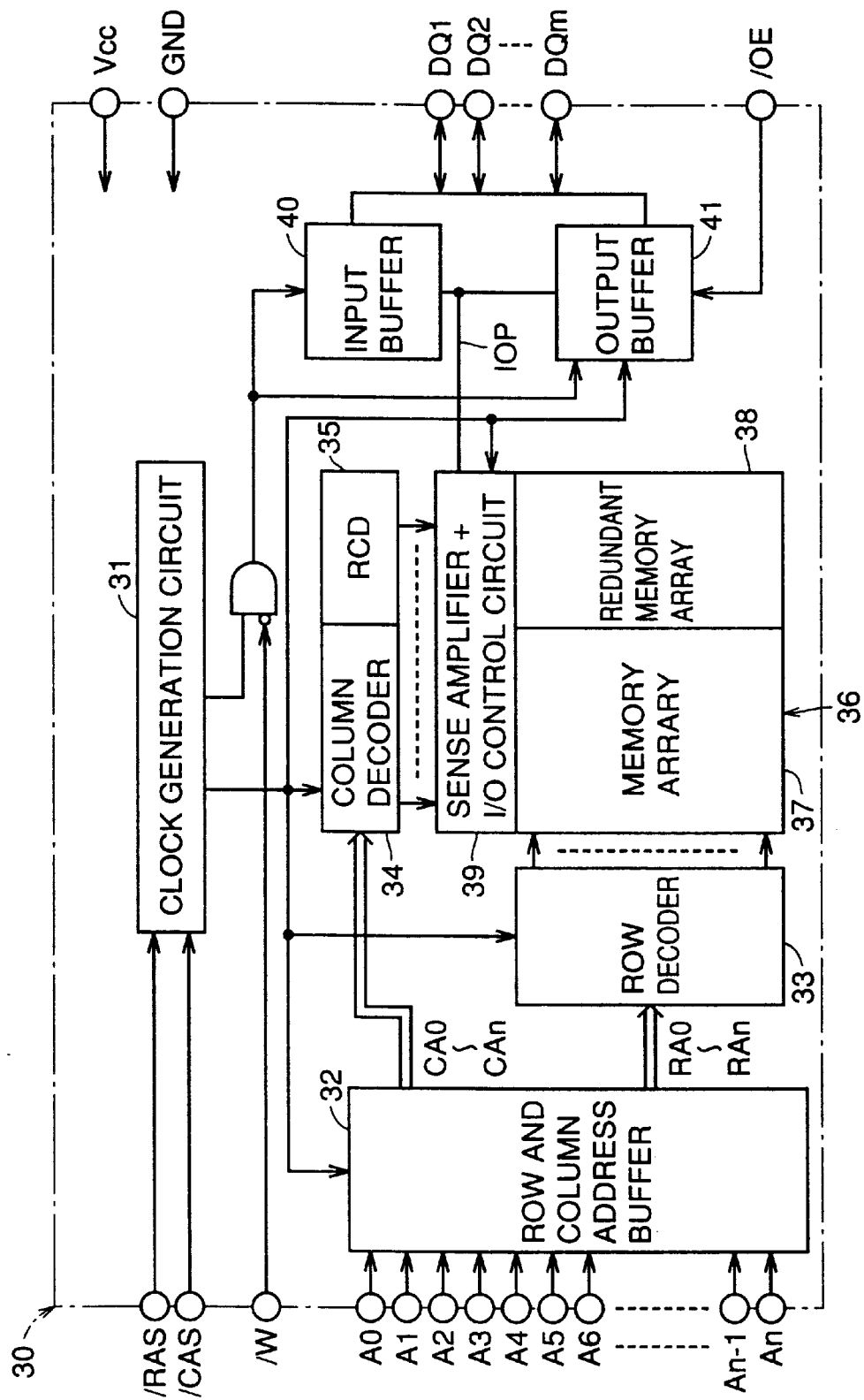
FIG. 18 is a block diagram showing a general configuration of a conventional DRAM.
Figure 19:
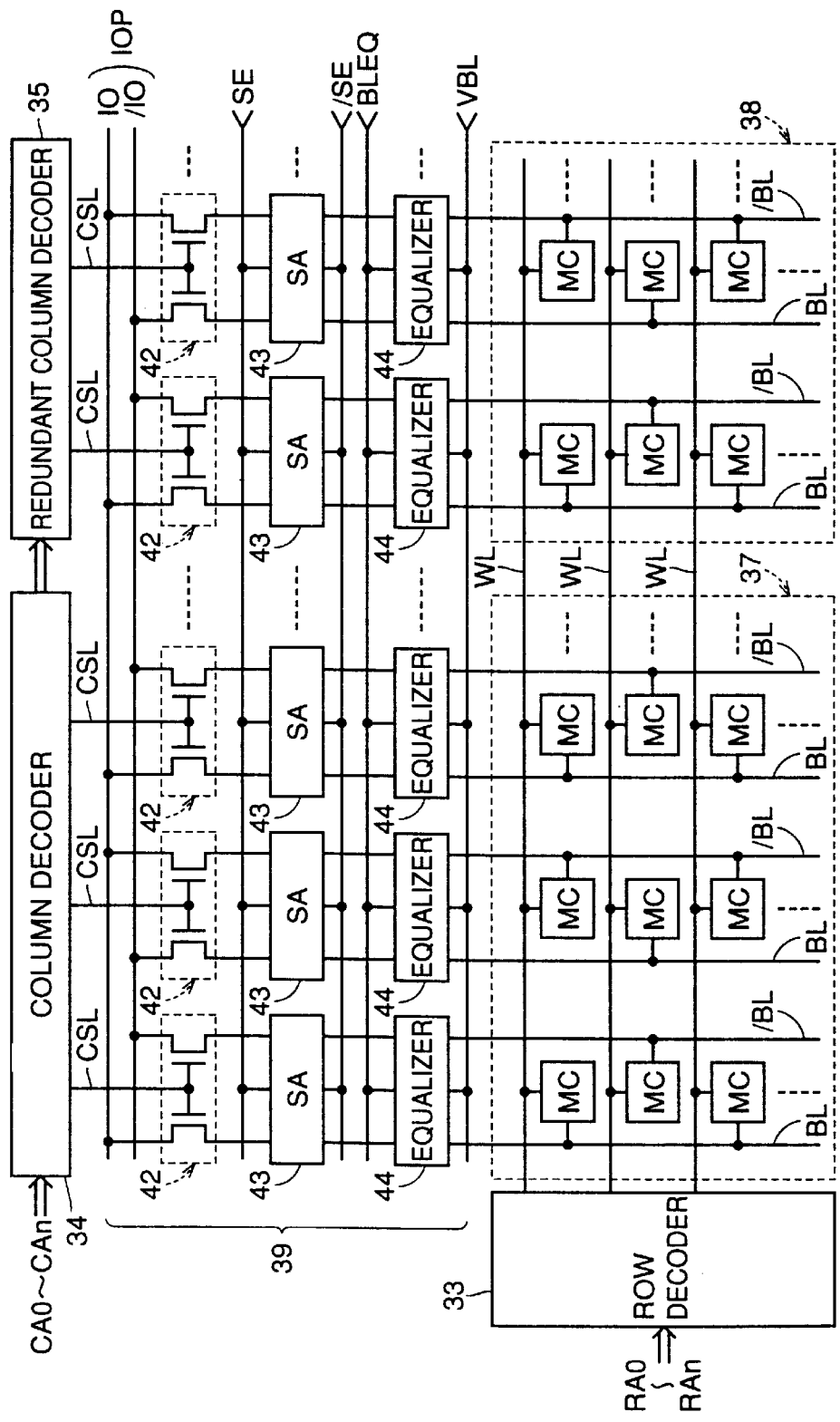
FIG. 19 is a circuit block diagram showing a configuration of the FIG. 18 memory mat.
Figure 20:
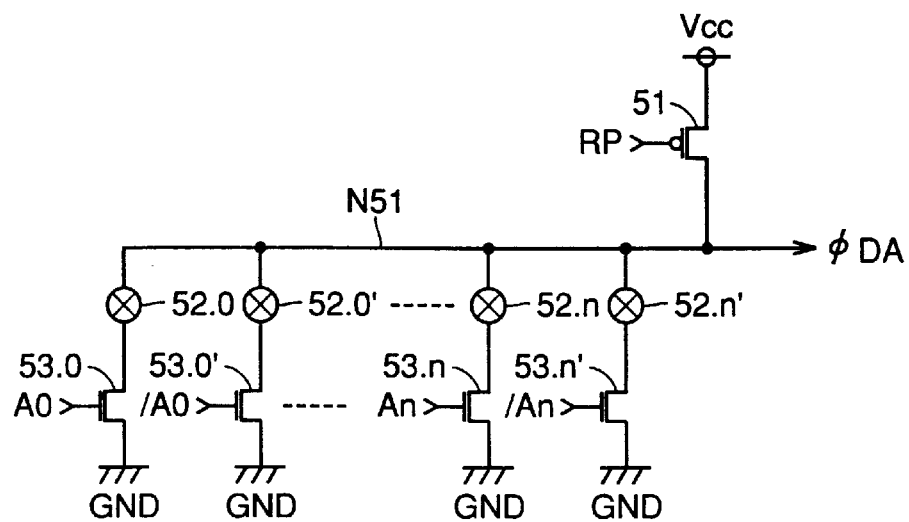
FIG. 20 is a circuit diagram showing a configuration of a conventional program circuit.
Figure 21:
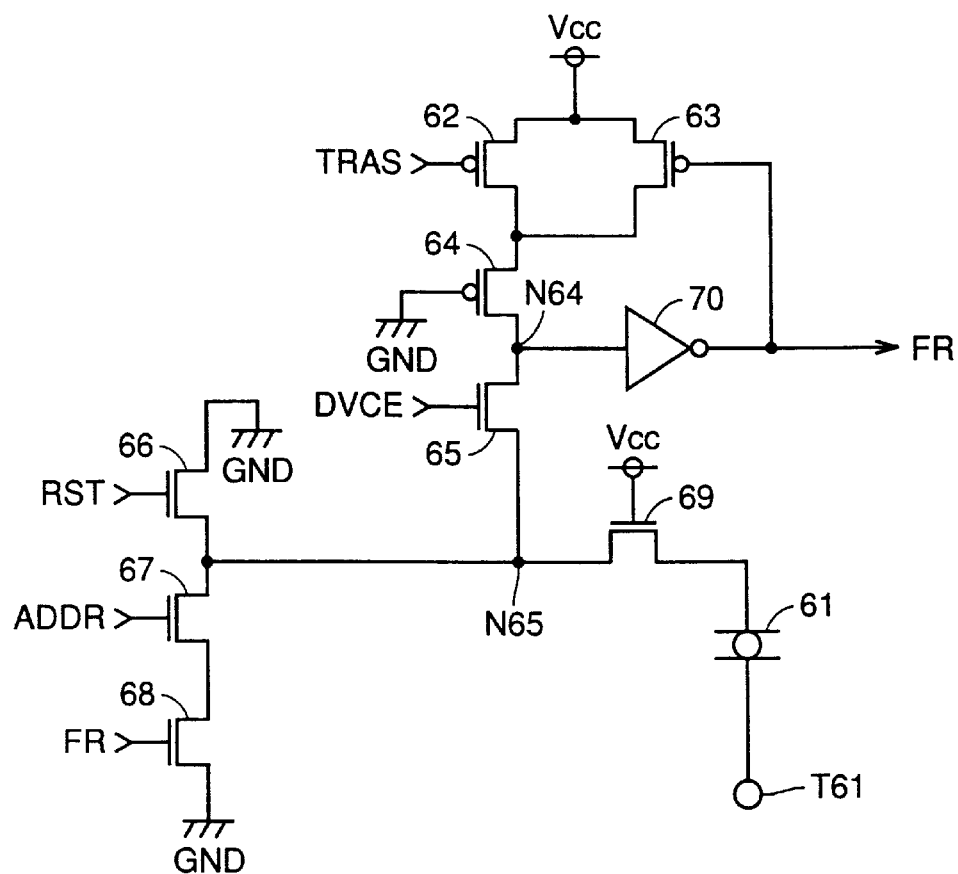
FIG. 21 is a circuit diagram showing a configuration of a conventional fuse circuit.

Antifuse 1 is connected between a node N1 and a ground potential GND line. N-channel MOS transistor 2 is connected between a power supply potential Vcc line and node N1 and has its gate receiving an address signal An. N-channel MOS transistor 3 is connected between node N1 and a ground potential GND line and has its gate receiving a complementary address signal /An. Capacitor 4 has one electrode connected to node N1 and the other electrode receiving a signal BST. Signal BST is generated e.g. in a dock generation circuit 31 shown in FIG. 18 and has large current driving capability.

Figure 2:
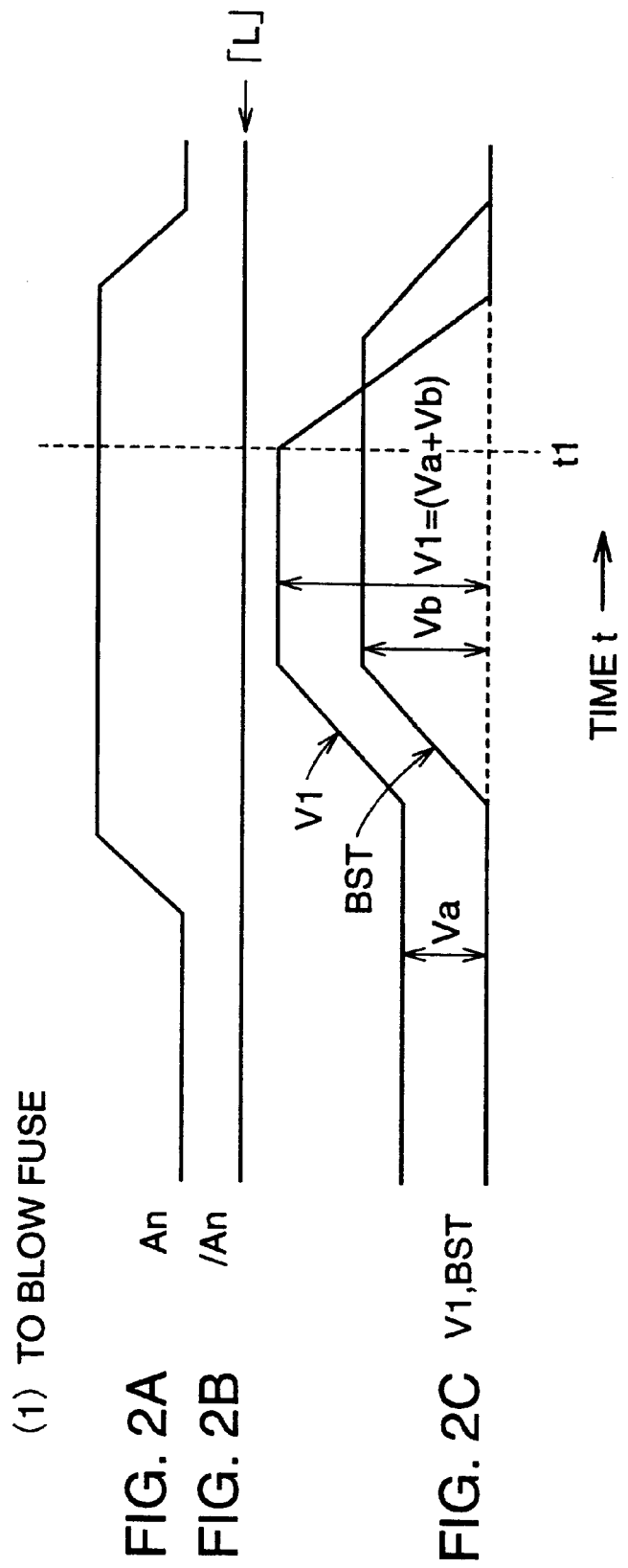
FIGS. 2A–2C are timing diagrams representing operation of the FIG. 1 fuse circuit.

Program operation of the fuse circuit will now be described. To blow antifuse 1, as shown in FIGS. 2A–2C, signals An, /An are set high and low, respectively, and node N1 is set high (Va≈Vcc=5V). In this state, when signal BST is raised from a low level (GND) to a high level (Vb=Vcc) a voltage V1 of node N1 is boosted to provide V1=Va+Vb. Thus antifuse 1 is blown, while n-channel MOS transistor 2 is turned off, having a gate voltage lower than source voltage V1.

Figure 3:
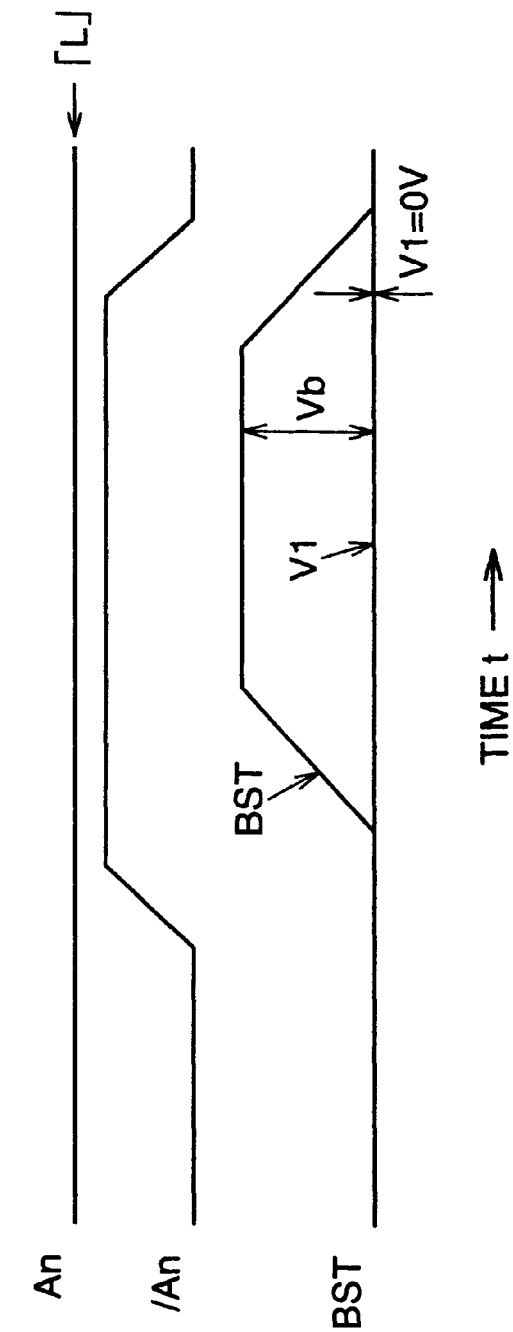
FIGS. 3A–3C are another timing diagrams representing operation of the FIG. 1 fuse circuit.

To remain antifuse 1 unblown, signals An and /An are set low and high, respectively, and node N1 is set low (GND), as shown in FIGS. 3A–3C. In this state, when signal BST is raised from a low level to a high level, voltage V1 of node N1 is boosted to Vb. With voltage Vb, however, antifuse 1 is not blown.

In accordance with the present embodiment, antifuse 1 is connected between node N1 and ground potential GND line and capacitor 4 has one electrode connected to node N1 and node N1 attains power supply potential Vcc before capacitor 4 receives power supply potential Vcc at the other electrode to boost the node N1 voltage from power supply potential Vcc to a high voltage 2 Vcc to blow antifuse 1. Antifuse 1 and capacitor 4 are connected in series, and excessive current does not flow when the resistance value of antifuse 1 decreases. This eliminates the necessity of conventional provision of a protection circuit. Furthermore the use of a power supply voltage rather than an external high voltage eliminates a control circuit for controlling the high voltage. Thus, the scale of the circuit can be smaller than conventional.

Second Embodiment

Figure 4:
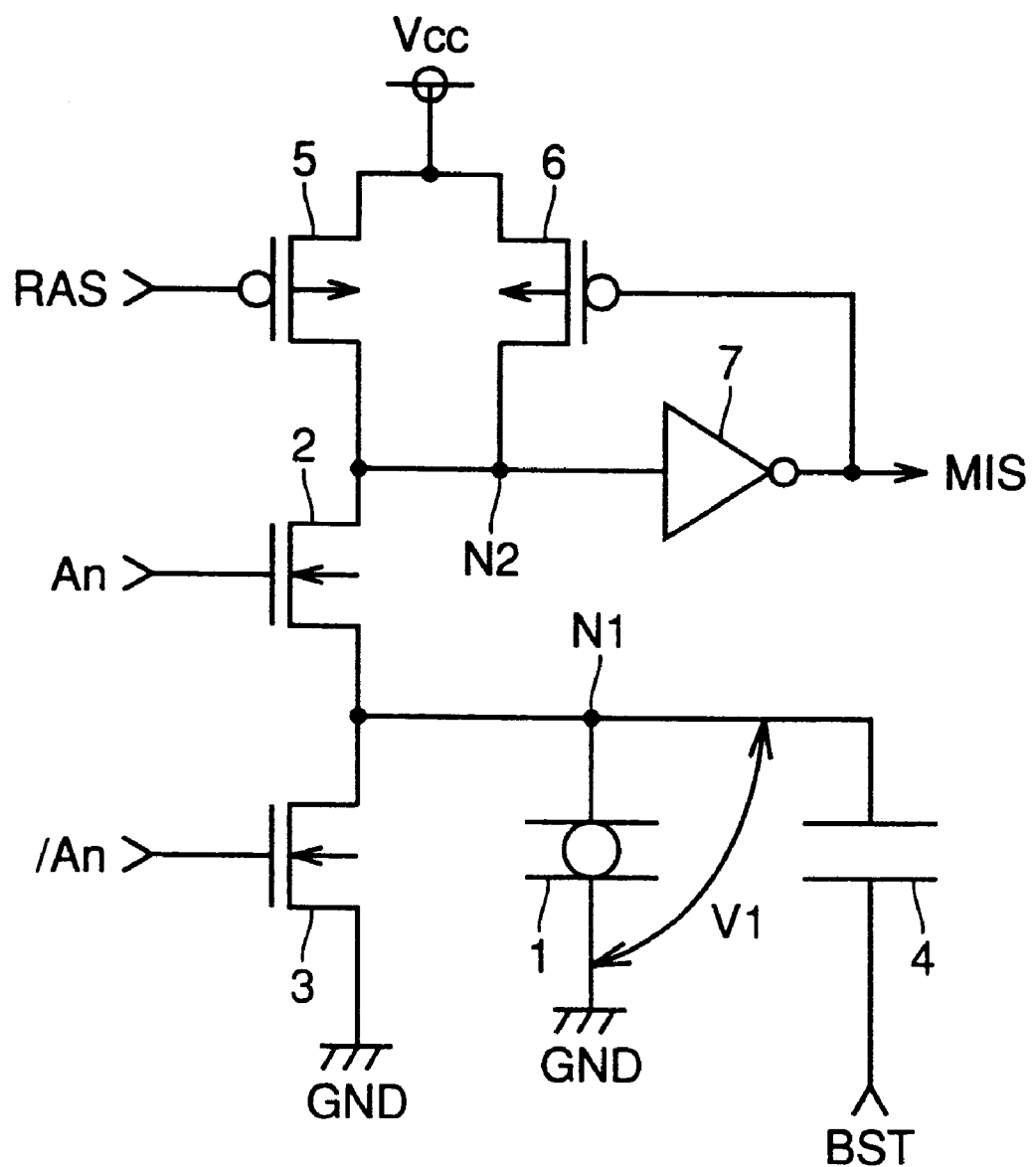
FIG. 4 a circuit diagram showing in principle a configuration of a redundancy determination circuit according to a second embodiment of the present invention.
Figure 5:
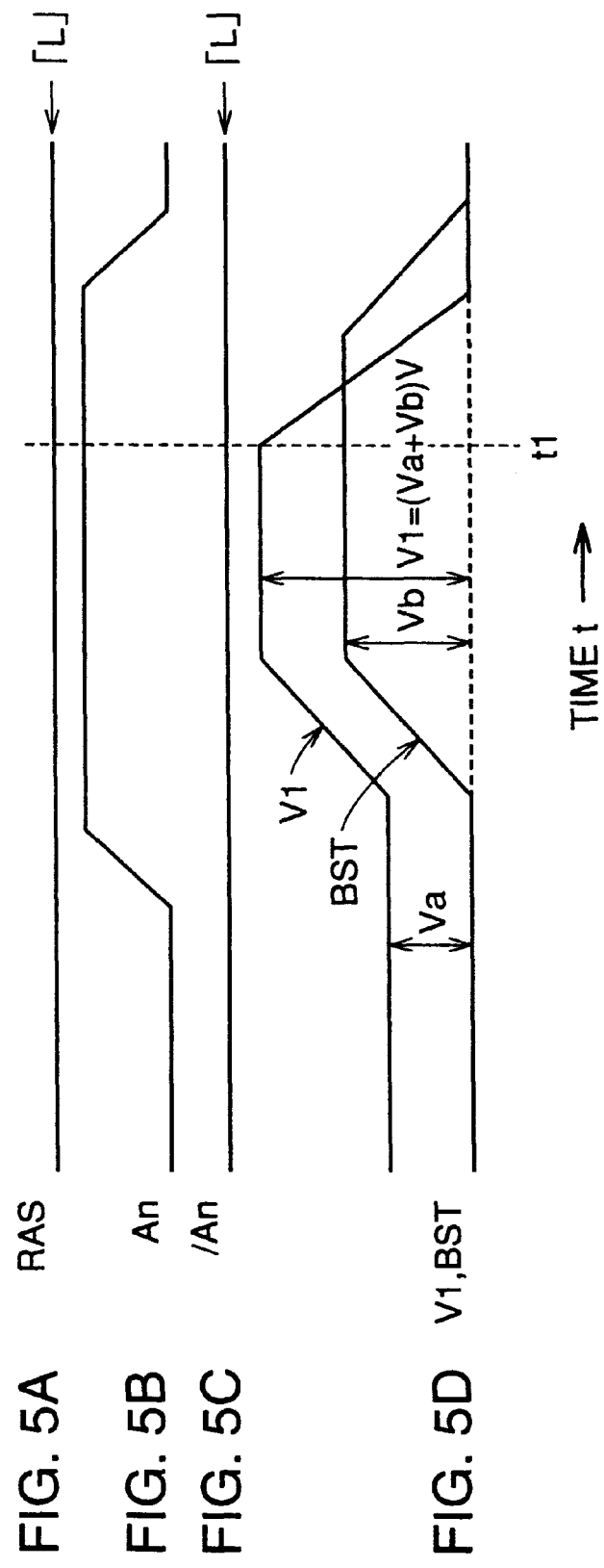
FIGS. 5A–5D are timing diagrams representing program operation of the FIG. 4 redundancy determination circuit.
Figure 6:
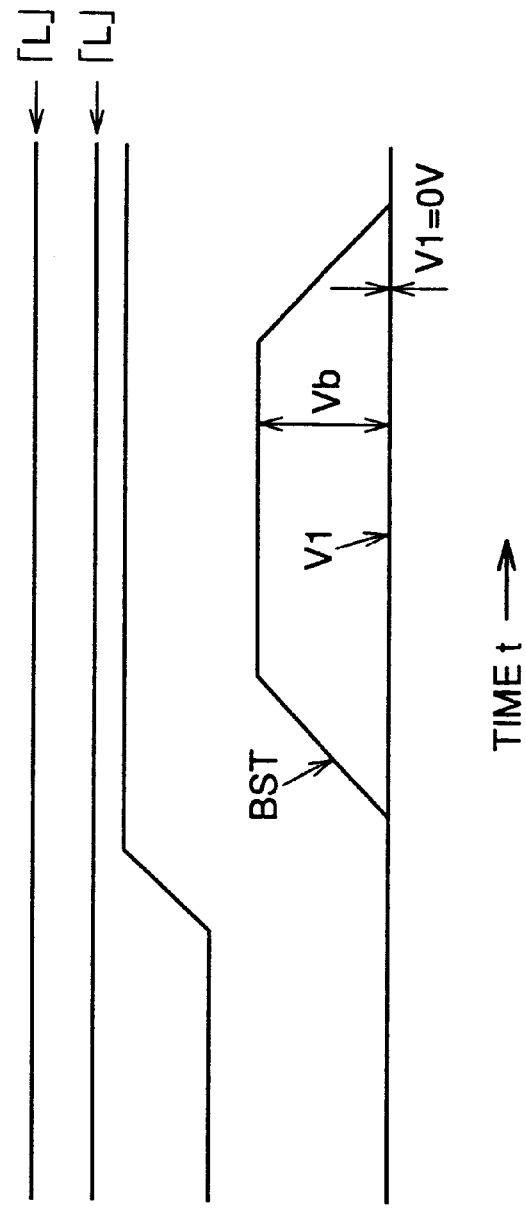
FIGS. 6A–6D are another timing diagrams representing program operation of the FIG. 4 redundancy determination circuit.

FIG. 4 is a circuit diagram showing in principle a configuration of a redundancy determination circuit according to a second embodiment of the present invention. The FIG. 4 redundancy determination circuit differs from the FIG. 1 fuse circuit in addition of a precharging circuit formed from p-channel MOS transistors 5, 6 and an inverter 7. P-channel MOS transistor 5 is connected between a power supply potential Vcc line and the n-channel MOS transistor 2 drain (node N2) and has its gate receiving a memory activation signal RAS. P-channel MOS transistor 6 is connected to p-channel MOS transistor 5 in parallel. Inverter 7 is connected between node N2 and the p-channel MOS transistor 6 gate. A signal output from inverter 7 serves as a signal MIS output from the redundancy determination circuit.

Program operation of the redundancy determination circuit will now be described. To blow antifuse 1, as shown in FIGS. 5A–5D, signal RAS is set low to turn on p-channel MOS transistors 5, 6. Then, signals An and /An are set high and low, respectively, and node N1 is set high, while signal BST is raised from a low level to a high level. Thus voltage V1 of node N1 is boosted to achieve V1=Va+Vb to blow antifuse 1.

Referring to FIGS. 6A–6D, to remain antifuse 1 unblown, signal RAS is set low to turn on p-channel MOS transistors 5, 6. Then, signals An and /An are set low and high, respectively, and node N1 is set low. In this state, when signal BST is raised from a low level to high level, voltage V1 of node N1 is boosted to Vb. With voltage Vb, however, antifuse 1 is not blown.

Figure 7:
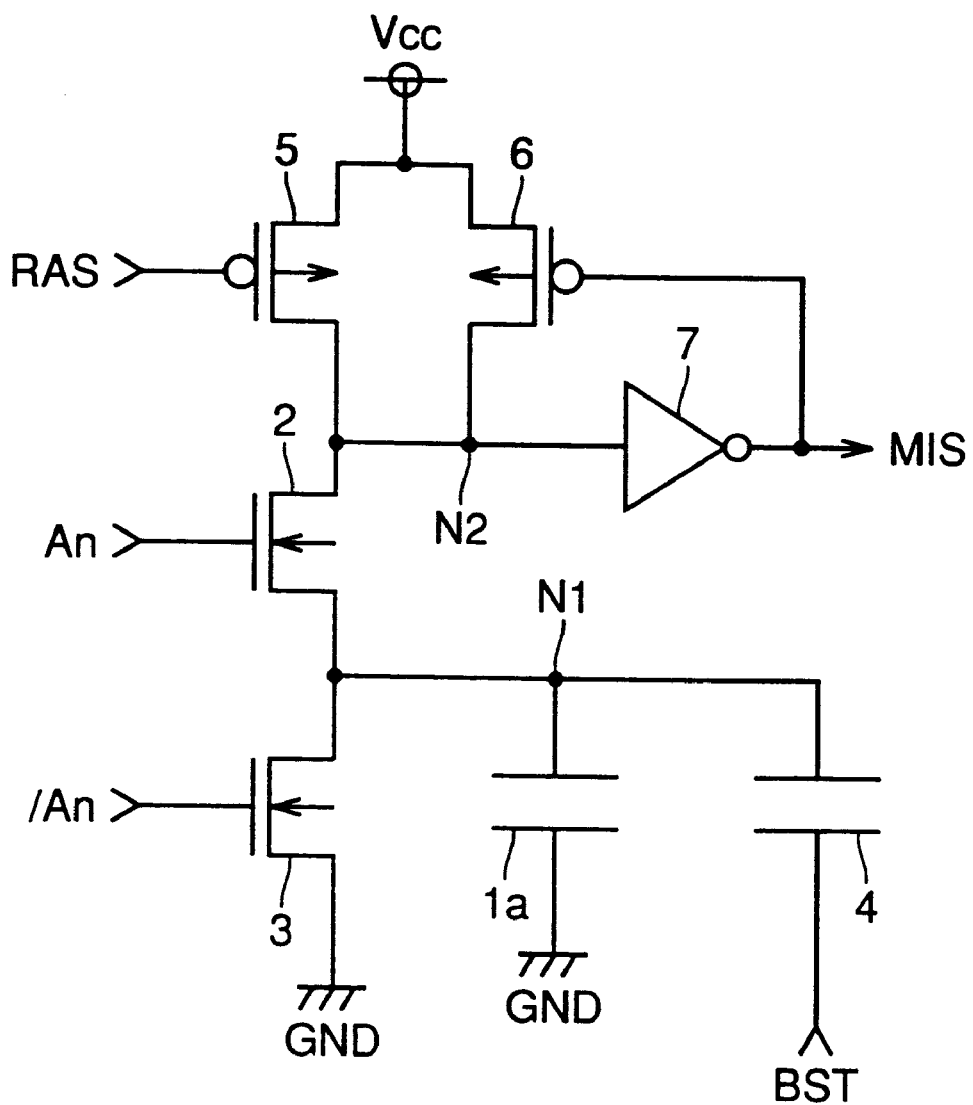
FIG. 7 is a circuit diagram for illustrating determination operation of the FIG. 4 redundancy determination circuit.
Figure 8:
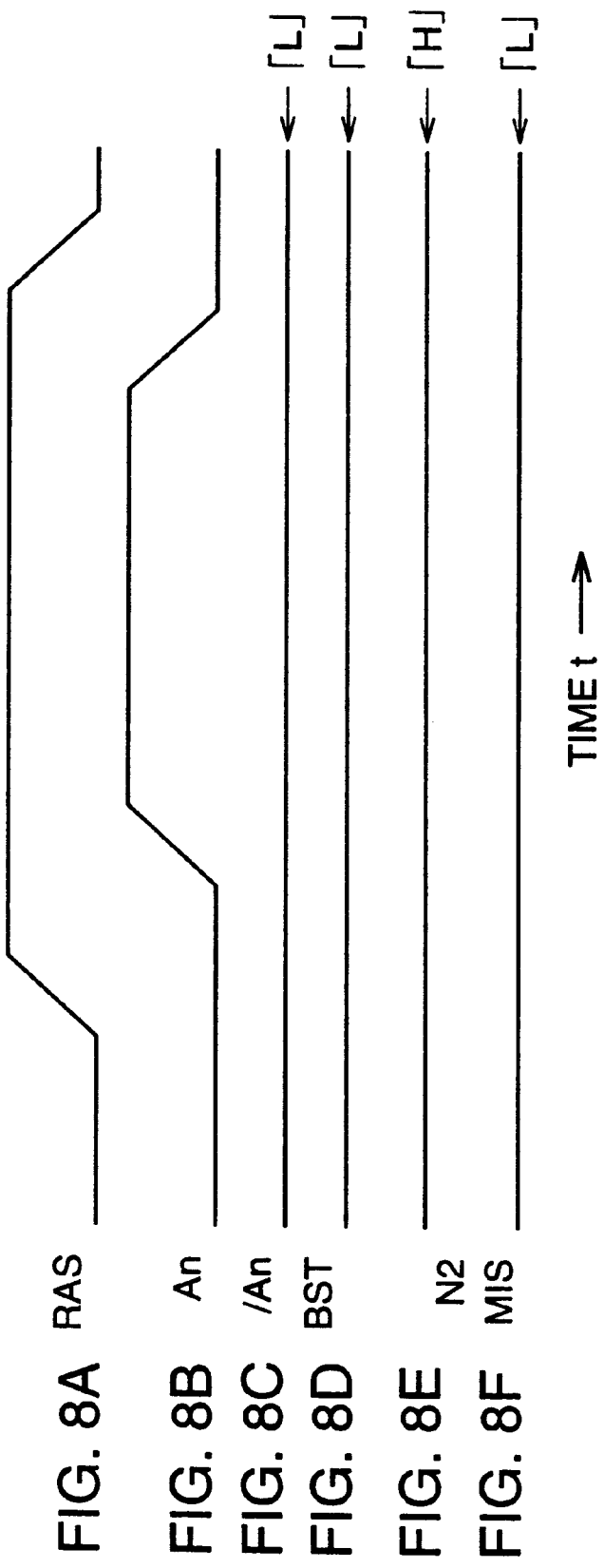
FIGS. 8A–8F are timing diagrams representing determination operation of the FIG. 7 redundancy determination circuit.

Determination operation of the redundancy determination circuit will now be described. When antifuse is unblown, antifuse 1 serves as capacitor 1a, as shown in FIG. 7.

In an initial state, as shown in FIGS. 8A–8F, signals RAS, An, /An are all held low, p-channel MOS transistors 5, 6 are turned on, n-channel MOS transistors 2, 3 are turned off, node N2 goes high, and signal MIS is held low.

Then, signal RAS goes high to turn off p-channel MOS transistor 5 and signals An, /An go high and low, respectively, to turn on and off n-channel MOS transistors 2, 3, respectively, while antifuse 1 serving as capacitor 1a allows the potential of node N2 to be held high and signal MIS to remain low.

Figure 9:
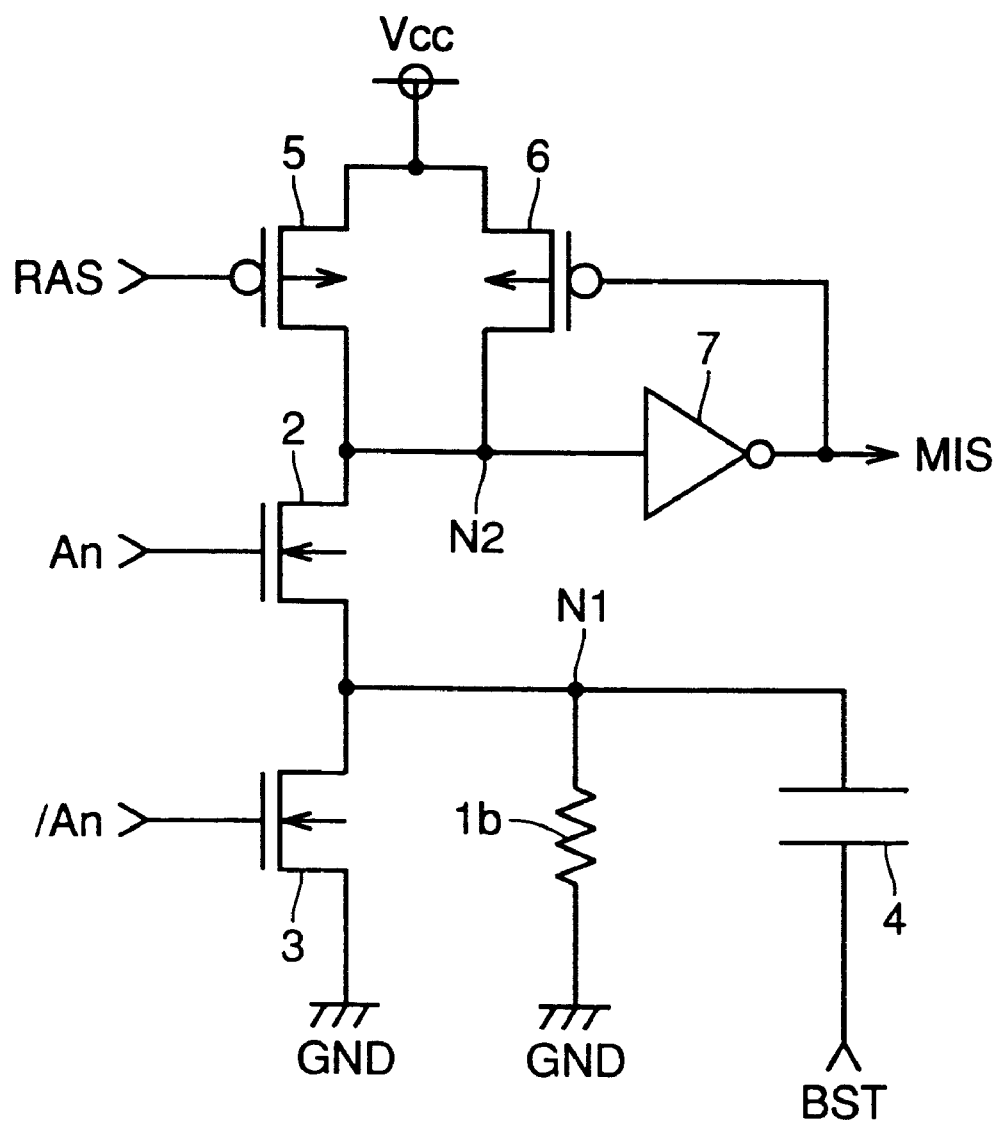
FIG. 9 is another circuit diagrams representing determination operation of the FIG. 4 redundancy determination circuit.
Figure 10:
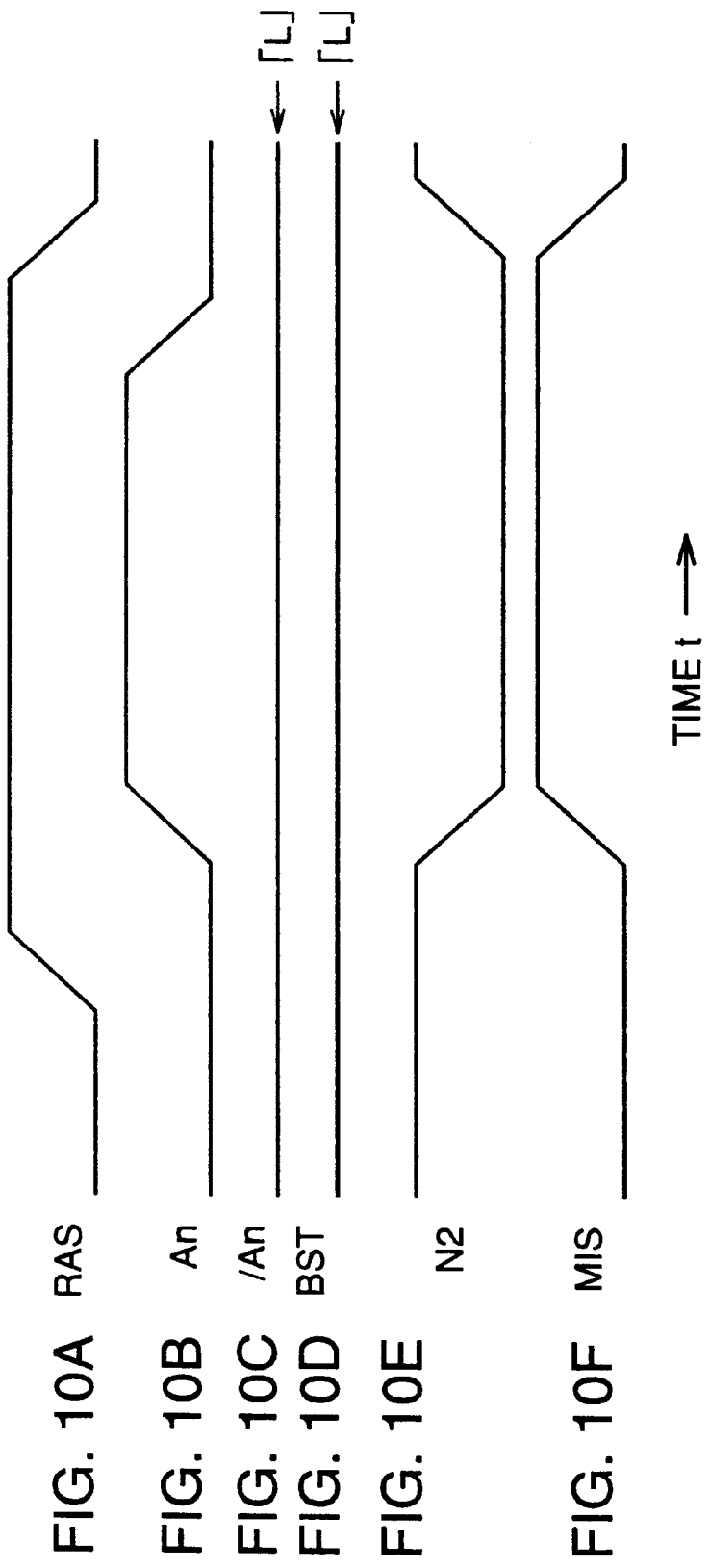
FIGS. 10A–10F are timing diagrams representing determination operation of the FIG. 9 redundancy determination circuit.

When antifuse 1 is blown, antifuse 1 serves as a resistance element 1b, as shown in FIG. 9. In an initial state, as shown in FIGS. 10A–10F, signals RAS, An, /An are all held low, node N2 goes high, and signal MIS is held low. Then, signal RAS goes high to turn on p-channel MOS transistor 5, and signals An, /An go high and low, respectively, to turn on and off n-channel MOS transistors 2, 3, respectively, while antifuse 1 serving as resistance element 1b allows the potentials of nodes N1, N2 to go low and signal MIS to go high. After determination, signals RAS, An, /An all go low to return to the initial state.

Figure 11:
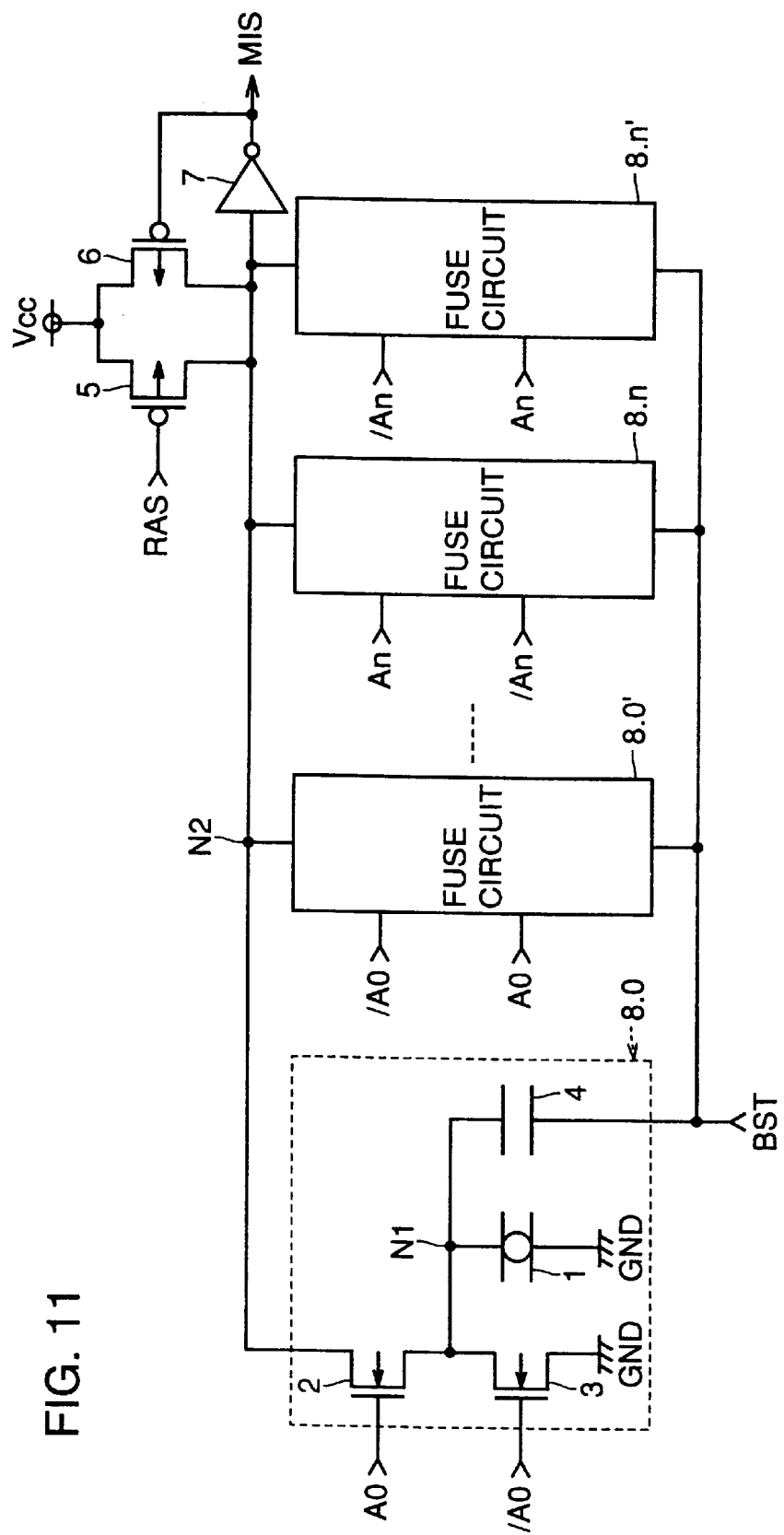
FIGS. 11 is a circuit block diagram showing a specific configuration of a redundancy determination circuit described with reference to FIGS. 4–10.

FIG. 11 is a circuit block diagram showing a specific configuration of the redundancy determination circuit described with reference to FIGS. 4–10. Referring to FIG. 11, the redundancy determination circuit includes fuse circuits 8.0 to 8.n, 8.0' to 8.n', p-channel MOS transistors 5, 6, and an inverter 7.

Fuse circuits 8.0 to 8.n, 8.0' to 8.n' are each the same as the FIG. 1 fuse circuit, including antifuse 1, n-channel MOS transistors 2, 3 and capacitor 4. Fuse circuit 8.0 is provided for address signal A0, the n-channel MOS transistors 2, 3 gates respectively receiving signals A0, /A0. Fuse circuit 8.0' is provided for complementary address signal /A0, the n-channel MOS transistors 2, 3 gates respectively receiving signals /A0, A0. The other fuse circuits 8.1 to 8.n, 8.1' to 8.n' operate similarly. The n-channel MOS transistor 2 drain of each of fuse circuits 8.0 to 8.n, 8.0' to 8. n' is connected to node N2.

P-channel MOS transistor 5 is connected between a power supply potential Vcc line and node N2 and has its gate receiving signal RAS. P-channel MOS transistor 6 is connected to p-channel MOS transistor 5 in parallel. Inverter 7 is connected between node N2 and the gate of p-channel MOS transistor 6. A signal output from inverter 7 serves as signal MIS output from the redundancy determination circuit.

Operation of the redundancy determination will now be described.

For example, a defective address corresponding to address signals A0, A1, . . . , An=1, 1, . . . , 1 is programmed by applying the inverted version of address signals A0, A1, . . . , An, i.e. 0, 0, . . . , 0. Thus, antifuse 1 is blown in fuse circuits 8.0' to 8.n' and unblown in fuse circuits 8.0' to 8.n'.

In determination operation, only when address signals A0, A1, . . . , An corresponding to the defective address, i.e., 1, 1, . . . , 1, is input a non-conducting state is achieved between node N2 and the ground potential line and signal MIS remains low. Then, it is determined that the defective address has been input and a spare row or column is selected in place of the row or column corresponding to the defective address.

Third Embodiment

Figure 12:
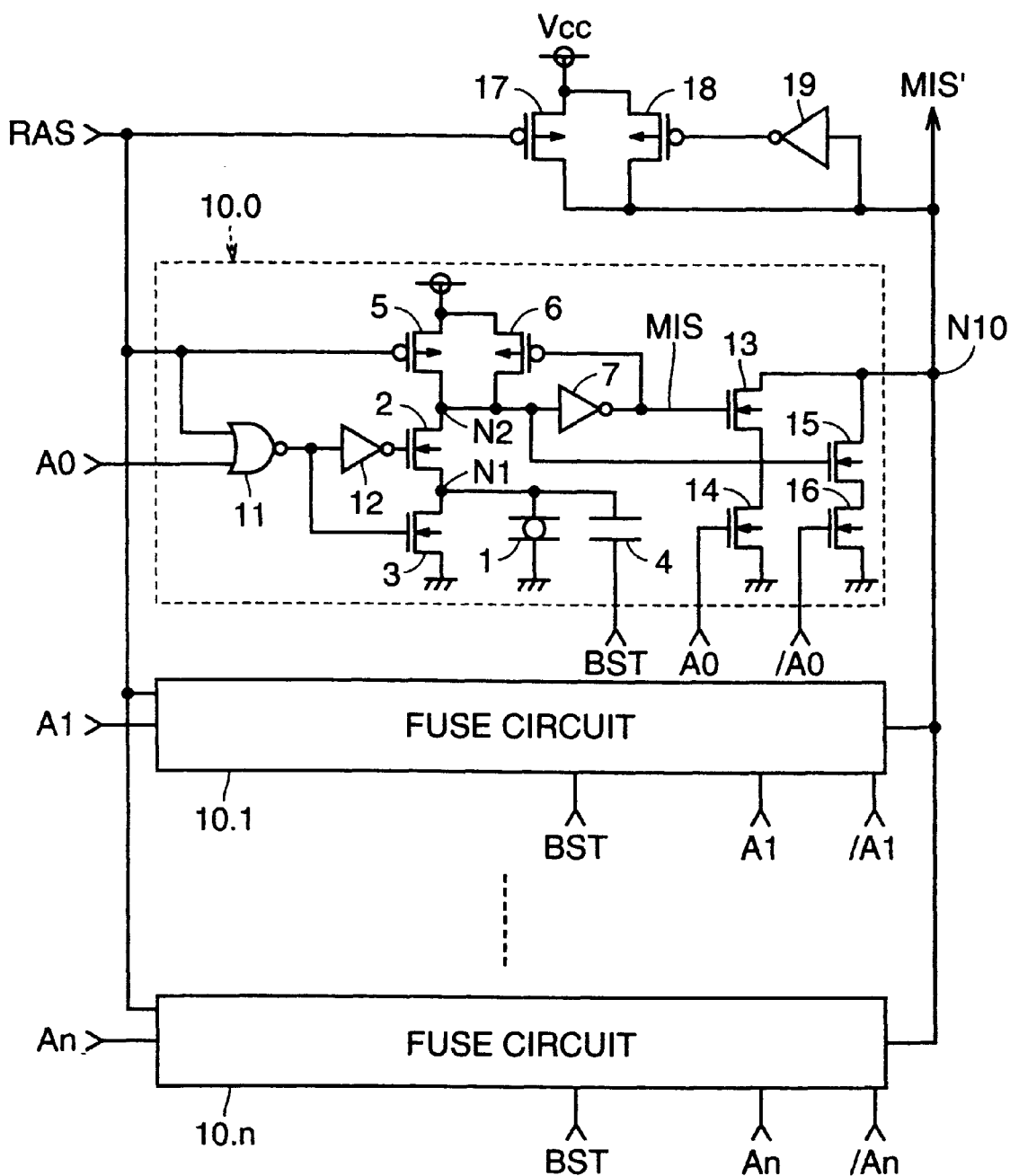
FIGS. 12 is a circuit block diagram showing a configuration of a redundancy determination circuit according to a third embodiment of the present invention.

FIG. 12 is a circuit block diagram showing a configuration of a redundancy determination circuit according to a third embodiment of the present invention.

The redundancy determination circuit shown in FIG. 12 includes fuse circuits 10.0 to 10.n, p-channel MOS transistors 17, 18, and an inverter 19. P-channel MOS transistors 17, 18 and inverter 19 configure a precharge circuit.

Fuse circuits 10.0 to 10.n are provided for address signals A0 to An, respectively. Fuse circuit 10.0 includes an antifuse 1, n-channel MOS transistors 2, 3, 13 to 16, a capacitor 4, p-channel MOS transistors 5, 6, inverters 7, 12, and an NOR gate 11. Antifuse 1, n-channel MOS transistors 2, 3, capacitor 4, p-channel MOS transistors 5, 6, and inverter 7 are connected in a similar manner to the FIG. 4 redundancy determination circuit.

NOR gate 11 receives signal RAS and A0. An output from NOR gate 11 is input to the gate of n-channel MOS transistor 2 via inverter 12 and to the gate of n-channel MOS transistor 3 directly. N-channel MOS transistors 13, 14 are connected in series between a node N10 and a ground potential GND line, and so are n-channel MOS transistors 15, 16. The n-channel MOS transistor 13 gate receives signal MIS and the n-channel MOS transistor 15 gate is connected to node N2. The n-channel MOS transistors 14, 16 gates receive signals A0, /A0, respectively. The other fuse circuits 10.1 to 10.n are configured similarly.

P-channel MOS transistor 17 are connected between a power supply potential Vcc lne and node N10 and has its gate receiving signal RAS. P-channel MOS transistor 18 is connected between the power supply potential Vcc line and node N10. Inverter 19 is connected between node N10 and the gate of p-channel MOS transistor 18. The potential of node N10 serves as a signal MIS' output from the redundant circuit.

Program operation of the redundancy determination circuit will now be described. For example, a defective address corresponding to address signals A0, A1, . . . , An=0, 0, . . . , 0 is programmed by setting signal RAS low and applying the inverted version of address signals A0, A1, . . . , An, i.e., 1, 1,1, . . . , 1, as shown in FIGS. 13A–13D. Thus, the antifuses of fuse circuits 10.1 to 10.n are blown.

Determination operation of the circuit will now be described. In an initial state, as shown in FIGS. 14A–14F, signals RAS, An, /An, BST are all held low, MOS transistors 3, 5, 6, 15, 17, 18 are turned on, MOS transistors 2, 13, 14, 16 are turned off, and signals MIS, MIS' are held low and high, respectively.

Then, when signal RAS goes high, MOS transistors 3, 5, 17 are turned off and MOS transistor 2 is turned on. Since the fuse circuits 10.0 to 10.n antifuses 1 have been blown and thus serves as resistance elements in this example, nodes N1, N2 go low and signal MIS goes high to turn on n-channel MOS transistor 13 and turn off n-channel MOS transistor 15. It should be noted that when antifuse 1 is unblown and thus serves as a capacitor, signal MIS remains low and n-channel MOS transistor 15 is turned on and n-channel MOS transistor 13 is turned off.

Then, only when address signals A0 to An that are programmed, i.e., A0, A1, . . . , An=0, 0, . . . , 0, are input, a non-conducting state is achieved between node N10 and the ground potential GND line and signal MIS' remains high. Thus, determination is made that a defective address has been input and a spare row or column is selected in place of the row or column corresponding to the defective address.

Fourth Embodiment

As described above, blown antifuse 1 serves as a resistance element 1b. However, when the resistance value of resistance element 1b is too large, the redundancy determination circuit does not operate normally. The present embodiment proposes a circuit which detects the resistance value of blown antifuse 1.

Figure 15:
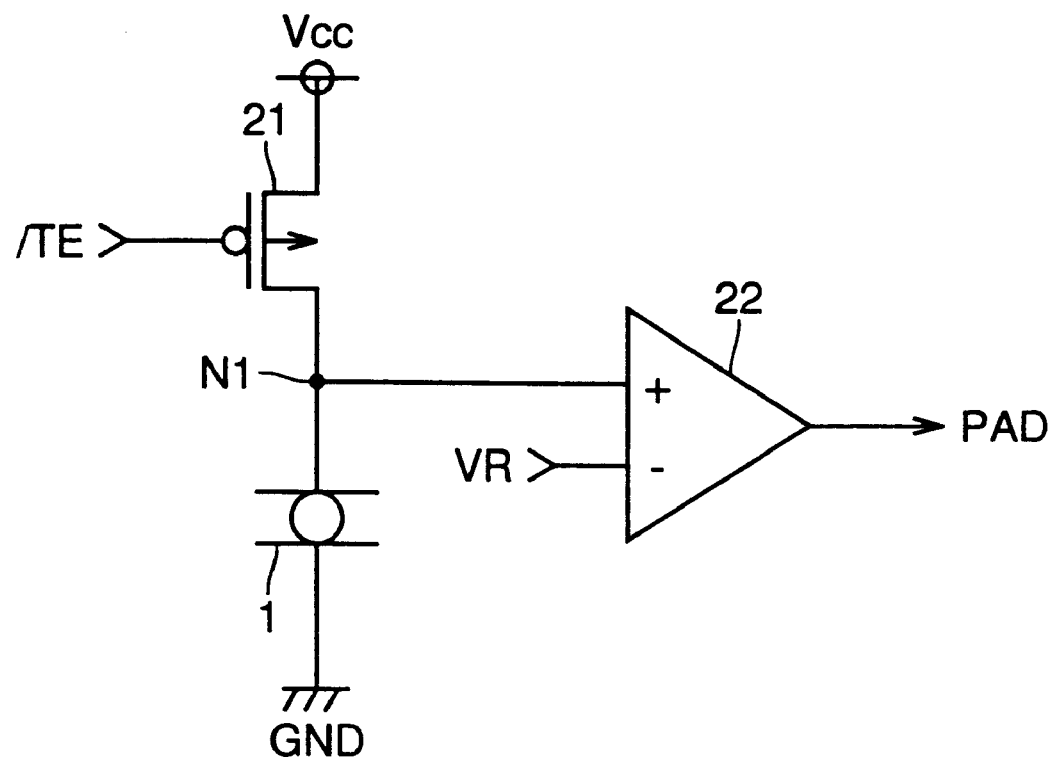
FIG. 15 is a circuit diagram showing a configuration of a fuse resistance detection circuit according to a fourth embodiment of the present invention.

FIG. 15 is a circuit diagram showing a configuration of a fuse resistance detection circuit according to a fourth embodiment of the present invention.

The fuse resistance detection circuit shown in FIG. 15 includes a p-channel MOS transistor 21 and a comparator 22. An antifuse 1 is connected between node N1 and a ground potential GND line. P-channel MOS transistor 21 is connected between a power supply potential Vcc line and node N1 and has its gate receiving a test signal /TE. P-channel MOS transistor 21 has a predetermined conduction resistance value. Comparator 22 compares the potential of node N1 to a reference potential VR. When the potential of node N1 is higher than reference potential VR, comparator 22 outputs a high-level signal. When the potential of node N1 is lower than VR, comparator 22 outputs a low-level signal. Reference potential VR is a predetermined potential between power supply potential Vcc and ground potential GND. The signal output from comparator 22 serves as a signal PAD output from the resistance detection circuit.

Operation of the fuse resistance detection circuit will now be described. In resistance detection, test signal /TE goes low and p-channel MOS transistor 21 is turned on. The potential of node N1 is a voltage obtained by dividing power supply potential Vcc in voltage by p-channel MOS transistor 21 and antifuse 1.

If antifuse 1 is unblown and thus serves as a capacitor, the potential of node N1 is nearly equal to power supply potential Vcc and signal PAD goes high. If antifuse 1 has been blown and thus serves as a resistance element, higher resistance values of the resistance element result in higher potentials of node N1 and lower resistance values of the resistance element result in lower potentials of node N1. Thus, the resistance value of antifuse 1 can be monitored by monitoring the potential of node N1.

When the resistance value of antifuse 1 is sufficiently decreased and signal PAD is low, determination is made that antifuse 1 has been blown completely. When the resistance value of antifuse 1 is not sufficiently decreased and signal PAD is high, determination is made that antifuse 1 is not completely blown.

In accordance with the present embodiment, it can be detected whether blown antifuse 1 has a sufficiently small resistance value so that the redundancy determination circuit can be prevented from erroneous operation.

Fifth Embodiment

Figure 16:
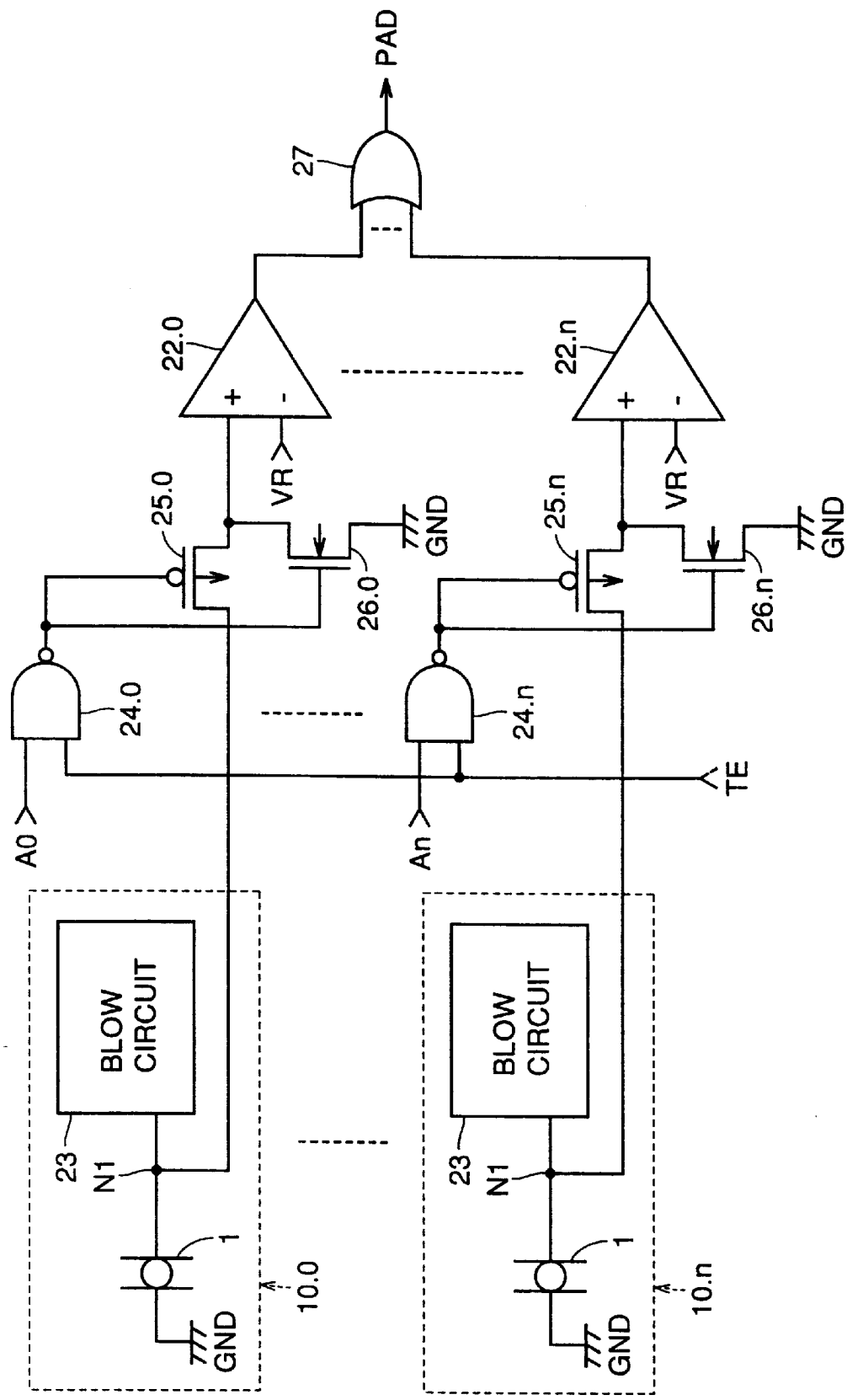
FIG. 16 is a circuit block diagram showing a configuration of a fuse resistance detection circuit according to a fifth embodiment of the present invention.

FIG. 16 is a circuit block diagram showing a configuration of a fuse resistance detection circuit according to a fifth embodiment of the present invention. The fuse resistance detection circuit is applied e.g. to the FIG. 12 redundancy detection circuit. In FIG. 16, the portions other than antifuse 1 of each of fuse circuits 10.0 to 10.n are included in a blow circuit 23.

The fuse resistance detection circuit includes NAND gates 24.0 to 24.n, p-channel MOS transistors 25.0 to 25.n, n-channel MOS transistors 26.0 to 26.n, comparators 22.0 to 22.n, and an NOR gate 27. NAND gates 24.0 to 24.n, p-channel MOS transistors 25.0 to 25.n, n-channel MOS transistors 26.0 to 26.n, and comparators 22.0 to 22.n are provided for address signal A0 to An, respectively.

NAND gate 24.0 receives address signal A0 and test signal TE. P-channel MOS transistor 25.0 is connected between node N1 of fuse circuit 10.0 and a non-inverted input terminal of comparator 22.0 and has its gate receiving an output from NAND gate 24.0. N-channel MOS transistor 26.0 is connected between the non-inverted input terminal of comparator 22.0 and a ground potential GND line and has its gate receiving the output from NAND gate 24.0. Comparator 22.0 compares the potential of the non-inverted input terminal to reference potential VR of its inverted input terminal. When the potential of the non-inverted input terminal is higher than reference potential VR, comparator 22.0 outputs a high-level signal. When the potential of the non-inverted input terminal is lower than reference potential VR, comparator 22.0 outputs a low-level signal. The other NAND gates 24.1 to 24.n, p-channel MOS transistors 25.1 to 25.n, n-channel MOS transistors 26.1 to 26.n, and comparators 22.1 to 22.n operate similarly. OR gate 27 receives outputs from comparators 22.0 to 22.n. A signal output from OR gate 27 serves as signal PAD output from the fuse resistance detection circuit.

Operation of the fuse resistance detection circuit will now be described. For example, when address signals A0, A1, . . . , An=0, 1, . . . , 1 are applied for programming and fuse circuits 10.0 to 10.n have their antifuses 1 blown and fuse circuit 10.0 has antifuse 1 unblown, signal RAS is initially raised high and address signals A0, A1, . . . , An=0, 1, . . . , 1 are applied. Thus, in fuse circuits 10.0 to 10.n a potential corresponding to a resistance value of antifuse 1 appears at node N1.

Then, when test signal TE is set high, MOS transistors 25.0 to 25.n, 26.0 are turned on and MOS transistors 25.0, 26.1 to 26.n are turned off, fuse circuits 10.0 to 10.n and comparators 22.1 to 22.n are coupled together and the non-inverted input terminal of comparator 22.0 is grounded and comparator 22.0 provides a low-level output.

When antifuses 1 of fuse circuits 10.0 to 10.n have sufficiently small resistance values, comparators 22.0 to 22.n output low-level signals and signal PAD thus goes low. When any one of antifuses 1 of fuse circuits 10.0 to 10.n has a high resistance value, the comparator for the antifuse 1 outputs a high-level signal and signal PAD thus goes high. By monitoring signal PAD, it can be checked whether antifuse 1 blowing has been performed normally.

The present embodiment provides the same effect as the fourth embodiment. Furthermore, in accordance with the present embodiment, since the outputs of comparators 22.0 to 22.n are output via OR gate 27, whether or not a plurality of antifuses 1 have normally been blown can be checked at one time and the number of external pins can be reduced as compared to the case where the outputs of comparators 22.0 to 22.n are output individually.

Figure 17:
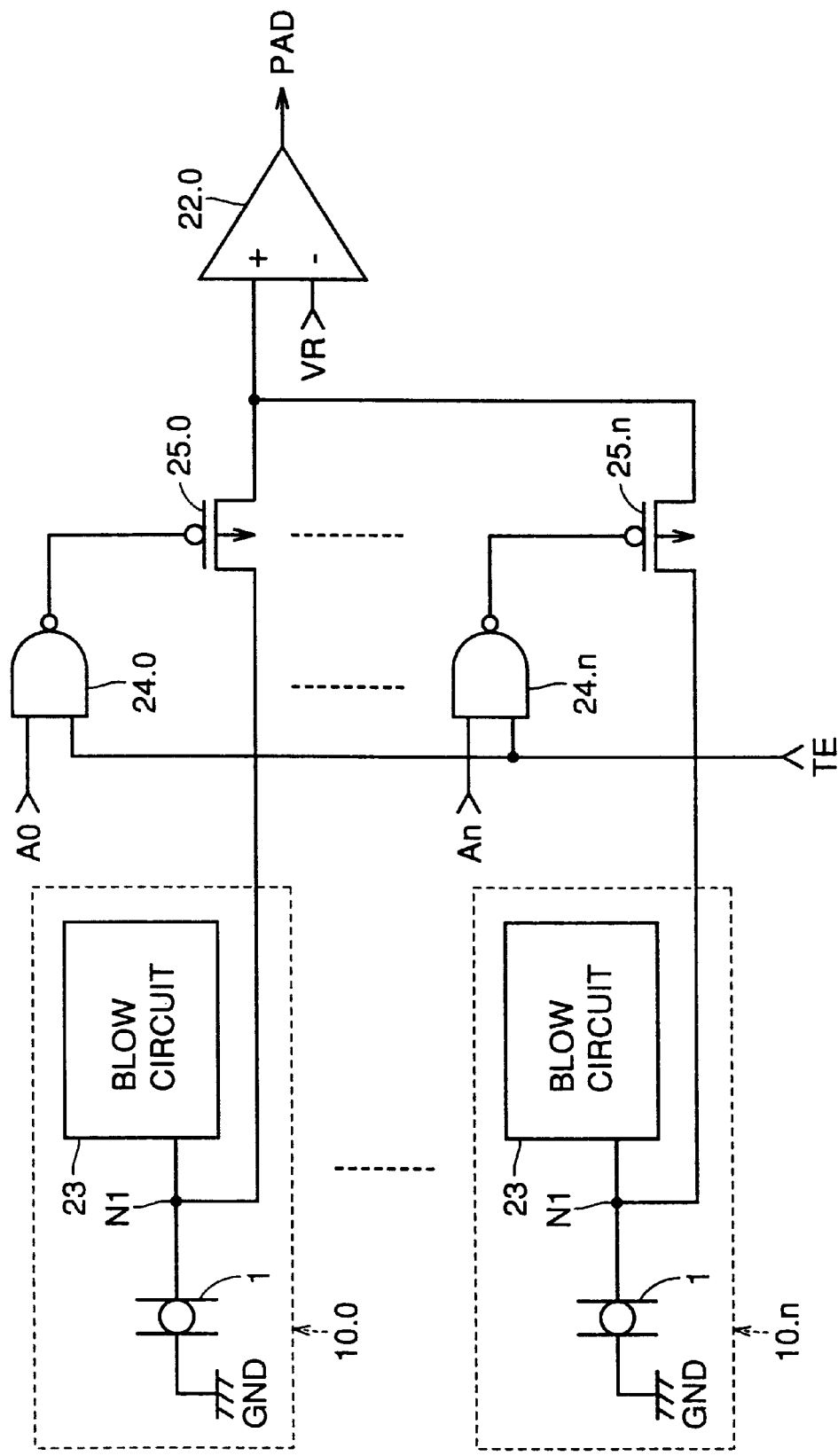
FIG. 17 is a circuit block diagram showing a modification of the FIG. 16 fuse resistance detection circuit.

It should also be noted that n-channel MOS transistors 26.0 to 26.n, comparators 22.1 to 22.n and OR gate 27 can be omitted, as shown in FIG. 17. In this example, layout area can be reduced. More specifically, in this example, it is necessary to input address signals A0 to An one by one and measure the resistance values of antifuses 1 of fuse circuits 10.0 to 10.n one by one.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device with an antifuse having a resistance value reduced when said antifuse is blown, comprising:

a capacitor having one electrode connected to one electrode of said antifuse;

a first voltage apply circuit for applying a power supply voltage across one and the other electrodes of said capacitor; and a second voltage apply circuit for applying said power supply voltage across the other electrode of said capacitor charged by said first voltage apply circuit and the other electrode of said antifuse and boosting a voltage across the electrodes of said antifuse to blow said antifuse.

2. The semiconductor device according to claim 1, wherein:

said antifuse is used to program a signal having one of first and second logical levels;

said first voltage apply circuit applies said power supply voltage across one and the other electrodes of said capacitor when an input signal is at said first logical level, and said first voltage apply circuit connects one and the other electrodes of said capacitor together when said input signal is at said second logical level;

said second voltage apply circuit in program operation applies said power supply voltage across the other electrode of said capacitor charged or discharged by said first voltage apply circuit and the other electrode of said antifuse to boost the voltage across the electrodes of said antifuse; and said antifuse is blown when said capacitor is charged by said first voltage apply circuit, and said antifuse is unblown when said capacitor is discharged by said first voltage apply circuit.

3. The semiconductor device according to claim 2, wherein:

the other electrode of said antifuse is connected to a line of a first power supply potential;

said first voltage apply circuit includes a first switching element having a first electrode connected to one electrode of said capacitor and a second electrode connected to a line of a second power supply potential, conducting when said input signal attains said first logical level, and a second switching element connected between one electrode of said capacitor and the line of said first power supply potential, conducting when said input signal attains said second logical level;

the other electrode of said capacitor receives said first power supply potential; and said second voltage apply circuit applies in said program operation said second power supply potential to the other electrode of said capacitor charged or discharged by said first voltage apply circuit to boost the potential across the electrodes of said antifuse.

4. The semiconductor device according to claim 3, said antifuse being used to determine a logical level of an input signal, further comprising;

a third switching element connected the line of said second power supply potential and the second electrode of said first switching element, conducting in said program operation and conducting in a determination operation for a predetermined period before a signal is input; and a determination circuit detecting in said determination operation to which of said first and second power supply potentials a potential of a second electrode of said third switching element is closer after the signal is input, for determining that a signal of said first logical level has been input when the potential of the second electrode of said third switching element is closer to said first power supply potential and determining that either a signal of said second logical level has been input or said antifuse is unblown when the potential of the second electrode of said third switching element is closer to said second power supply potential.

5. The semiconductor device according to claim 1, further comprising a resistance detection circuit for detecting whether a resistance value of said antifuse is higher or lower than a predetermined resistance value to output a signal of a level corresponding to a result of the detection.

6. The semiconductor device according to claim 4, wherein:

said semiconductor device is a semiconductor memory device including a plurality of memory cells each assigned a specific address, and a spare memory cell for substituting for a defective memory cell of said plurality of memory cells;

the address of each memory cell is specified by a plurality of address signals each having one of said first and second logical levels;

said antifuse and said first voltage apply circuit are provided for each of a plurality of address signals and each of a plurality of complementary address signals;

in said programming operation, a plurality of address signals and a plurality of complementary address signals specifying an address of said defective memory cell are each inverted in logical level and applied to a respective first voltage apply circuit; and said determination circuit in said determination operation detects to which of said first and second power supply potentials the potential of the second electrode of said third switching element is closer after a plurality of address signals and a plurality of complementary address signals are input, to determine that an address of a normal memory cell has been input when the potential of the second electrode of said third switching element is closer to said first power supply potential and to determine that the address of said defective memory cell has been input when the potential of the second electrode of said third switching element is closer to said second power supply potential so as to output a substitution signal for substituting said spare memory cell for said defective memory cell.

7. The semiconductor device according to claim 6, further comprising:

a resistance detection circuit provided for each antifuse, for detecting whether a resistance value of a respective antifuse is higher or lower than a predetermined resistance value to output a signal of a first level when the resistance value of the respective antifuse is higher than the predetermined resistance value and to output a signal of a second level when the resistance value of the respective antifuse is lower than the predetermined resistance value;

a control circuit for coupling a blown one of said plurality of antifuses and a resistance detection circuit for the blown antifuse together while setting a signal from a resistance detection circuit for an unblown antifuse at said second level; and a logic circuit responsive to a plurality of said resistance detection circuits all outputting a signal of said second level, for outputting a signal indicating that antifuse blowing has normally been performed.

8. The semiconductor device according to claim 6, further comprising:

a resistance detection circuit for detecting whether a resistance value of said antifuse is higher or lower than a predetermined resistance value to output a signal of a level corresponding to a result of the detection; and a select circuit for selecting any of said plurality of antifuses and coupling the selected antifuse and said resistance detection circuit together.

9. The semiconductor device according to claim 4, said semiconductor device being a semiconductor memory device including a plurality of memory cells each assigned a specific address and spare memory cell for substituting for a defective memory cell of said plurality of memory cells, the address of each memory cell being specified by a plurality of address signals each having one of said first and second logic levels, said antifuse, said first voltage apply circuit, said third switch and said determination circuit being provided for each of a plurality of address signals, in said program operation, a plurality of address signals specifying an address of said defective memory cell being each inverted in logical level and applied to a respective first voltage apply circuit, in said determination operation, each said first voltage apply circuit receiving a signal of said first logical level rather than a corresponding address signal, each said determination circuit detecting in said determination operation to which of said first and second power supply potentials the potential of the second electrode of a respective third switching element is closer after the signal of said first logical level is input, to output a signal of said first logical level when the potential of the second electrode of the respective third switching element is closer to said first power supply potential and to output a signal of said second logical level when the potential of the second electrode of the respective third switching element is closer to said second power supply potential, the semiconductor device further comprising a total-determination circuit detecting whether each inverted version of signals output from a plurality of said determination circuits and a corresponding one of a plurality of address signals input match in logical level, for determining that an address of said defective memory cell has been input when they match and outputting a substitution signal for substituting said defective memory cell with said spare memory cell.

10. The semiconductor device according to claim 9, said total-determination circuit includes:

a fourth switching element having a first electrode connected to the line of said second power supply potential and conducting in said determination operation for a predetermined period before said plurality of address signals and said plurality of complementary address signals are input;

first and second transistors provided for each address signal and connected in series between a second electrode of said fourth switching element and the line of said first power supply potential, one transistor receiving at its gate a signal output from a respective determination circuit and the other transistor receiving at its gate a corresponding address signal, said first and second transistors conducting when a signal received thereby is a signal of said first logical level; and third and fourth transistors provided for each complementary address signal and connected in series between the second electrode of said fourth switching element and the line of said first power supply potential, one transistor receiving at its gate an inverted version of a signal output from a respective determination circuit and the other transistor receiving at its gate a corresponding complementary address signal, said third and fourth transistors conducting when a signal received thereby is a signal of said first logical level; wherein said total-determination circuit determines in said determination operation to which of said first and second power supply potentials the potential of the second electrode of said fourth switching element is closer after a plurality of address signals and a plurality of complementary address signals are input, to determine that an address of said defective memory cell has been input when the potential of the second electrode of said fourth switching element is closer to said second power supply potential.

11. The semiconductor device according to claim 9, further comprising:

a resistance detection circuit provided for each antifuse, for detecting whether a resistance value of a respective antifuse is higher or lower than a predetermined resistance value to output a signal of a first level when the resistance value of the respective antifuse is higher than the predetermined resistance value and to output a signal of a second level when the resistance value of the respective antifuse is lower than the predetermined resistance value;

a control circuit for coupling a blown one of said plurality of antifuses and a resistance detection circuit for the blown antifuse together while setting a signal from a resistance detection circuit for an unblown antifuse at said second level; and a logic circuit responsive to a plurality of said resistance detection circuits all outputting a signal of said second level, for outputting a signal indicating that the antifuse blowing has normally been performed.

12. The semiconductor device according to claim 9, further comprising:

a resistance detection circuit for detecting whether a resistance value of said antifuse is higher or lower than a predetermined resistance value to output a signal of a level corresponding to a result of the detection; and a select circuit for selecting any of said plurality of antifuses and coupling the selected antifuse and said resistance detection circuit together.

13. A semiconductor device with an antifuse having a resistance value reduced when said antifuse is blown, comprising a resistance detection circuit for detecting whether a resistance value of said antifuse is higher or lower than a predetermined resistance value to output a signal of a level corresponding to a result of the detection, wherein:

said antifuse has one electrode connected to a line of a first power supply potential; and said resistance detection circuit includes:

a transistor connected between the other electrode of said antifuse and a line of a second power supply potential and having a predetermined conduction resistance value, conducting in a test mode detecting the resistance value of said antifuse, and a potential comparator for comparing a potential of the other electrode of said antifuse to a predetermined reference potential in said test mode to output a signal of a level corresponding to a result of the comparison.

14. A semiconductor device with a plurality of antifuses, an antifuse of said plurality of antifuses having a resistance value reduced when said antifuse is blown, said semiconductor device comprising a resistance detection circuit for detecting whether a resistance value of said antifuse is higher or lower than a predetermined resistance value to output a signal of a level corresponding to a result of the detection, said resistance detection circuit being provided for each antifuse, detecting whether a resistance value of a respective antifuse is higher or lower than the predetermined resistance value to output a signal of a first level when the resistance value of the respective antifuse is higher than the predetermined resistance value and to output a signal of a second level when the resistance value of the respective antifuse is lower than the predetermined resistance value, the semiconductor device further comprising:

a control circuit for coupling a blown one of said plurality of antifuses with a respective resistance detection circuit while setting a signal output from a resistance detection circuit for an unblown antifuse at said second level; and a logic circuit responsive to a plurality of said resistance detection circuits all outputting a signal of said second level, for outputting a signal indicating that the antifuse blowing has normally being performed.

15. A semiconductor device with a plurality of antifuses, an antifuse of said plurality of antifuses having a resistance value reduced when said antifuse is blown, said semiconductor device comprising a resistance detection circuit for detecting whether a resistance value of said antifuse is higher or lower than a predetermined resistance value to output a signal of a level corresponding to a result of the detection, and a select circuit for selecting any of said plurality of antifuses and coupling the selected antifuse and said resistance detection circuit together.

16. The semiconductor device of claim 15, wherein:

said antifuse has one electrode connected to a line of a first power supply potential; and said resistance detection circuit includes:

a transistor connected between the other electrode of said antifuse and a line of a second power supply potential and having a predetermined conduction resistance value, conducting in a test mode detecting the resistance value of said antifuse, and a potential comparator for comparing a potential of the other electrode of said antifuse to a predetermined reference potential in said test mode to output a signal of a level corresponding to a result of the comparison.

17. The semiconductor device of claim 15, wherein:

said resistance detection circuit is provided for each antifuse, detecting whether a resistance value of a respective antifuse is higher or lower than the predetermined resistance value to output a signal of a first level when the resistance value of the respective antifuse is higher than the predetermined resistance value and to output a signal of a second level when the resistance value of the respective antifuse is lower than the predetermined resistance value, and the semiconductor device further comprises:

a control circuit for coupling a blown one of said plurality of antifuses with a respective resistance detection circuit while setting a signal output from a resistance detection circuit for an unblown antifuse at said second level; and a logic circuit responsive to a plurality of said resistance detection circuits all outputting a signal of said second level, for outputting a signal indicating that the antifuse blowing has normally being performed.

* * * * *